US011190012B2

(12) United States Patent
Ikeda

(10) Patent No.: US 11,190,012 B2
(45) Date of Patent: Nov. 30, 2021

(54) ELECTROSTATIC PROTECTION CIRCUIT

(71) Applicant: Seiko Epson Corporation, Tokyo (JP)

(72) Inventor: Masuhide Ikeda, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/940,434

(22) Filed: Jul. 28, 2020

(65) Prior Publication Data
US 2021/0036512 A1 Feb. 4, 2021

(30) Foreign Application Priority Data

Jul. 29, 2019 (JP) .............................. JP2019-138731

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01)

(58) Field of Classification Search
CPC .. H02H 9/046; H01L 27/0255; H01L 27/0262
USPC ........................................................ 361/56
See application file for complete search history.

(56) References Cited

U.S. PATENT DOCUMENTS

| 5,272,097 A | 12/1993 | Shiota | |
|---|---|---|---|
| 5,426,322 A | 6/1995 | Shiota | |
| 5,591,661 A | 1/1997 | Shiota | |
| 6,046,897 A * | 4/2000 | Smith | H01L 27/0251 361/111 |
| 9,013,845 B1 * | 4/2015 | Karp | H02H 3/202 361/56 |
| 9,812,437 B2 * | 11/2017 | Kakubari | H01L 27/0292 |
| 9,935,096 B2 * | 4/2018 | Ikeda | H01L 27/0635 |
| 2005/0088791 A1 * | 4/2005 | Wang | H01L 27/0292 361/56 |
| 2005/0270712 A1 * | 12/2005 | Huang | H01L 27/0251 361/90 |

(Continued)

FOREIGN PATENT DOCUMENTS

| JP | H06-125048 A | 5/1994 |
|---|---|---|
| JP | 2017-054864 A | 3/2017 |

*Primary Examiner* — Dharti H Patel
(74) *Attorney, Agent, or Firm* — Harness, Dickey & Pierce, P.L.C.

(57) ABSTRACT

An electrostatic protection circuit that is electrically connected to a first terminal to which a first voltage signal is input, a second terminal to which a second voltage signal whose potential is lower than that of the first voltage signal is input, and a connection terminal that is connected to an external circuit, and mitigates the influence of a surge voltage on an internal circuit, the electrostatic protection circuit including: a discharge node that is electrically connected to the first terminal via a first diode element; a first protection circuit that is electrically connected to the first terminal and the second terminal; a second protection circuit that is electrically connected to the discharge node and the connection terminal; and a third protection circuit that is electrically connected to the discharge node and the second terminal, and an anode of the first diode element is electrically connected to the first terminal, and a cathode of the first diode element is electrically connected to the discharge node.

7 Claims, 9 Drawing Sheets

(56) References Cited

U.S. PATENT DOCUMENTS

| | | | | |
|---|---|---|---|---|
| 2006/0092590 A1* | 5/2006 | Chuang | ............... | H01L 27/0285 |
| | | | | 361/91.1 |
| 2009/0316316 A1* | 12/2009 | Shiota | ................. | H01L 27/0285 |
| | | | | 361/56 |
| 2010/0238599 A1* | 9/2010 | Liang | ............... | H03K 19/00315 |
| | | | | 361/56 |
| 2011/0019319 A1* | 1/2011 | Okushima | ........... | H01L 27/0262 |
| | | | | 361/56 |

* cited by examiner

ELECTROSTATIC PROTECTION CIRCUIT

The present application is based on, and claims priority from JP Application Serial Number 2019-138731, filed Jul. 29, 2019, the disclosure of which is hereby incorporated by reference herein in its entirety.

BACKGROUND

1. Technical Field

The present invention relates to an electrostatic protection circuit.

2. Related Art

When a surge voltage such as an electrostatic voltage is applied to an integrated circuit device, an overvoltage and an overcurrent occur in the integrated circuit device due to the surge voltage, and, as a result, there is a risk that an internal circuit of the integrated circuit device will malfunction. Accordingly, there are known techniques for mitigating the risk that an integrated circuit device will malfunction, by providing, in the integrated circuit device, an electrostatic protection circuit for protecting an internal circuit against a surge voltage such as an electrostatic voltage, and protecting the internal circuit against a surge voltage using the electrostatic protection circuit.

For example, Patent Document 1 discloses an electrostatic protection circuit (ESD protection circuit) that is a protection circuit including three or more external terminals to which an ESD (Electro Static Discharge) voltage can be applied, diodes provided in correspondence with the three or more external terminals, and a common node to which the diodes are commonly connected, and, in the electrostatic protection circuit, the potential of a surge voltage is limited to a predetermined potential by providing the diodes on current paths between the common node and the external terminals corresponding to the diodes, such that a forward current flows from the external terminals to the common node.

In addition, Patent Document 2 discloses an electrostatic protection circuit (output protection circuit) that includes protection circuits provided respectively between a VDD line through which a positive power supply VDD is propagated and a terminal to which a signal is input from the outside or a terminal that outputs a signal to the outside and between the VDD line and a VSS line through which a negative power supply VSS is propagated.

JP-A-2017-054864 and JP-A-6-125048 are examples of the related art.

However, regarding the electrostatic protection circuit (ESD protection circuit) described in Patent Document 1, the first problem is that, when the magnitudes of a positive surge current and a negative surge current that occur due to a surge voltage are different, voltages at which breakdown occurs in a first diode, a second diode, and a third diode need to be set in accordance with the magnitudes of such surge currents, and, as a result, there is a risk that the manufacturing cost will increase. The second problem is that characteristics of clamp voltages between a first external connection terminal and a second external connection terminal, between the first external connection terminal and a third external connection terminal, and between the second external connection terminal and the third external connection terminal are the same, and it is difficult to individually set characteristics of a clamp voltage for a plurality of terminals in the integrated circuit device. Furthermore, the third problem is that the magnitude of a surge voltage that is limited by the electrostatic protection circuit is determined based on breakdown voltages of the first diode, the second diode, and the third diode, and thus a hold voltage in the electrostatic protection circuit increases, and there is a risk that the electrostatic protection circuit will malfunction.

Applying the electrostatic protection circuit (output protection circuit) described with reference to FIG. 8 of Patent Document 2 is useful for the problems with the above-described electrostatic protection circuit described in Patent Document 1. However, in the electrostatic protection circuit described with reference to FIG. 8 of Patent Document 2, when a positive surge voltage is applied to input 101 to which electrostatic can be applied or output 102, the potential in the VDD line or the VSS line changes due to a surge current that flows due to the surge voltage, and there is a risk that the internal circuit will malfunction.

As described above, regarding the electrostatic protection circuits described in Patent Document 1 and Patent Document 2, there is a risk that the influence of a surge voltage cannot be sufficiently mitigated depending on the waveform and value of a surge voltage that is applied to the integrated circuit device, and there is room for improvement.

SUMMARY

An electrostatic protection circuit according an aspect of the present disclosure is electrically connected to a first terminal to which a first voltage signal is input, a second terminal to which a second voltage signal whose potential is lower than that of the first voltage signal is input, and a connection terminal that is connected to an external circuit, and mitigates the influence of a surge voltage on an internal circuit, the electrostatic protection circuit including:

a discharge node that is electrically connected to the first terminal via a first diode element;

a first protection circuit that is electrically connected to the first terminal and the second terminal;

a second protection circuit that is electrically connected to the discharge node and the connection terminal; and a third protection circuit that is electrically connected to the discharge node and the second terminal, and an anode of the first diode element is electrically connected to the first terminal, and a cathode of the first diode element is electrically connected to the discharge node.

In the electrostatic protection circuit according to another aspect, the second protection circuit may include:

a second diode element whose anode is electrically connected to the connection terminal, and whose cathode is electrically connected to the discharge node, a thyristor element whose anode is electrically connected to the discharge node, and whose cathode is electrically connected to the connection terminal, and a trigger element that is electrically connected to a gate of the thyristor element, and causes the thyristor element to operate, the thyristor element may include:

a first impurity-doped region provided on a substrate, and a second impurity-doped region provided in the first impurity-doped region, the anode of the thyristor element may be provided in the first impurity-doped region, and the cathode of the thyristor element may be provided in the second impurity-doped region.

In the electrostatic protection circuit according to another aspect, the second protection circuit may include:

a second diode element whose anode is electrically connected to the connection terminal, and whose cathode is electrically connected to the discharge node, a thyristor element whose cathode is electrically connected to the connection terminal, a voltage limiting element that is electrically connected to an anode of the thyristor element, and a trigger element that is electrically connected to a gate of the thyristor element, and causes the thyristor element to operate, the thyristor element may include:

a first impurity-doped region provided on a substrate, and a second impurity-doped region provided in the first impurity-doped region, the anode of the thyristor element may be provided in the first impurity-doped region, and the cathode of the thyristor element may be provided in the second impurity-doped region.

The electrostatic protection circuit according to another aspect may include a first resistive element whose one end is electrically connected to the first terminal, and whose other end is electrically connected to the discharge node.

The electrostatic protection circuit according to another aspect may include:

a second resistive element whose one end is electrically connected to the connection terminal, and whose other end is electrically connected to the internal circuit;

a third diode element whose anode is electrically connected to the other end of the second resistive element, and whose cathode is electrically connected to the first terminal; and a fourth diode element whose anode is electrically connected to the second terminal, and whose cathode is electrically connected to the other end of the second resistive element.

The electrostatic protection circuit according to another aspect may include:

a second resistive element whose one end is electrically connected to the connection terminal;

an NMOS transistor whose drain is electrically connected to another end of the second resistive element, whose source is electrically connected to the internal circuit, and whose gate is electrically connected to the first terminal;

a third diode element whose anode is electrically connected to the source of the NMOS transistor, and whose cathode is electrically connected to the first terminal; and a fourth diode element whose anode is electrically connected to the second terminal, and whose cathode is electrically connected to the other end of the second resistive element.

The electrostatic protection circuit according to another aspect may include:

a second resistive element whose one end is electrically connected to the connection terminal;

a PMOS transistor whose drain is electrically connected to another end of the second resistive element, whose source is electrically connected to the internal circuit, and whose gate is electrically connected to the second terminal;

a third diode element whose anode is electrically connected to the source of the PMOS transistor, and whose cathode is electrically connected to the first terminal; and a fourth diode element whose anode is electrically connected to the second terminal, and whose cathode is electrically connected to the source of the PMOS transistor.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, preferable embodiments of the disclosure will be described using the drawings. The drawings to be used are merely for description. Note that the embodiments given below are not intended to unduly limit the scope of the disclosure recited in the appended claims. In addition, not all of the constituent elements described below are essential to the disclosure. Note that a description will be given below taking an integrated circuit device provided with an electrostatic protection circuit of the present disclosure, as an example.

1. First Embodiment

Configuration of Integrated Circuit Device

Figure 1:
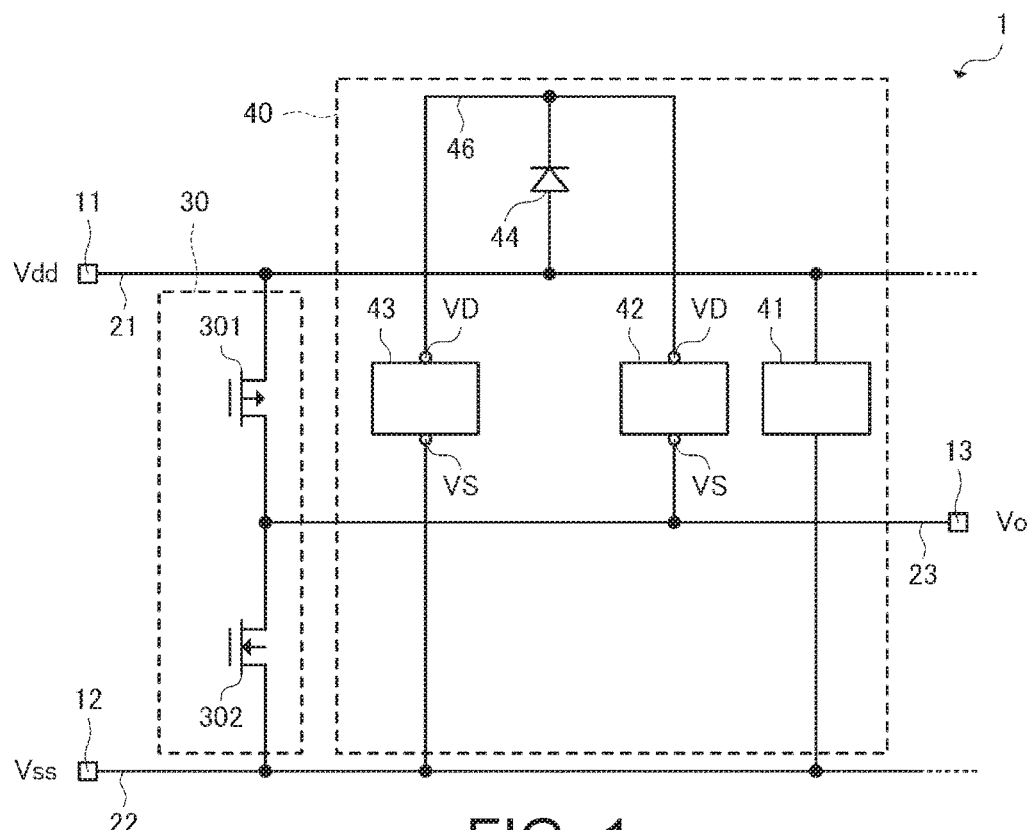
FIG. 1 is a diagram showing the configuration of an integrated circuit device.

FIG. 1 is a diagram showing the configuration of an integrated circuit device 1 that includes an electrostatic protection circuit 40, according to a first embodiment. As shown in FIG. 1, the integrated circuit device 1 includes terminals 11, 12, and 13, an internal circuit 30, and the electrostatic protection circuit 40. In the integrated circuit device 1 according to the first embodiment, various constituent elements of the integrated circuit device 1 that include the internal circuit 30 operate based on the difference in potential between a voltage signal Vdd that is input to the terminal 11 and a voltage signal Vss that is input to the terminal 12, the potential of the voltage signal Vss being lower than that of the voltage signal Vdd. In addition, the integrated circuit device 1 outputs, from the terminal 13, a voltage signal Vo that is based on such an operation. The electrostatic protection circuit 40 is electrically connected to the terminal 11 to which the voltage signal Vdd is input, the terminal 12 to which the voltage signal Vss whose potential is lower than that of the voltage signal Vdd is input, and the terminal 13 that is connected to an external circuit of the integrated circuit device 1. The electrostatic protection circuit 40 mitigates the influence of a surge voltage on the internal circuit 30. Note that, in the following description, a high-level logic signal is simply referred to as an "H level signal", and a low-level logic signal is simply referred to as an "L level signal". In addition, a surge voltage is a voltage generated due to electrostatic or the like, and is a voltage that differs largely in potential from the signal Vdd and the voltage signal Vss. In the following description, a surge voltage that is sufficiently larger than the potential of the voltage signal Vdd is referred to as a "positive surge voltage", and a surge voltage that is sufficiently smaller than the potential of the voltage signal Vss is referred to as a "negative surge voltage". In addition, the external circuit is one of various circuits, in various electronic apparatuses in which the integrated circuit device 1 is provided, for controlling operations of the electronic apparatuses, and the various circuits include a circuit that inputs various signals to the integrated circuit device 1, or a circuit that operates based on a signal output from the integrated circuit device 1.

Here, the voltage signal Vdd is an example of a first voltage signal, and the terminal 11 to which the voltage signal Vdd is input is an example of a first terminal. Also, the voltage signal Vss is an example of a second voltage signal, and the terminal 12 to which the voltage signal Vss is input is an example of a second terminal. In addition, the terminal 13 that outputs the voltage signal Vo to the external circuit is an example of a connection terminal.

The internal circuit 30 includes transistors 301 and 302. A description will be given assuming that the transistor 301 according to this embodiment is a P-channel MOS transistor, and the transistor 302 is an N-channel MOS transistor. The source of the transistor 301 is electrically connected to the terminal 11 via a propagation node 21. Also, the drain of the transistor 301 is electrically connected to the drain of the transistor 302. The source of the transistor 302 is electrically connected to the terminal 12 via a propagation node 22. In addition, a connection point at which the drain of the transistor 301 and the drain of the transistor 302 are connected is electrically connected to the terminal 13 via a propagation node 23.

In addition, an H-level or L-level signal that is based on an operation of the integrated circuit device 1 is input to the gates of the transistors 301 and 302. When an H-level signal is input to the gates of the transistors 301 and 302, control is performed so as to switch off the transistor 301 and switch on the transistor 302. Therefore, the internal circuit 30 outputs a signal whose potential is based on the voltage signal Vss, as the voltage signal Vo from the terminal 13. On the other hand, when an L-level signal is input to the gates of the transistors 301 and 302, control is performed so as to switch on the transistor 301 and switch off the transistor 302. Therefore, the internal circuit 30 outputs a signal whose potential is based on the voltage signal Vdd, as the voltage signal Vo from the terminal 13.

Accordingly, in the integrated circuit device 1 according to the first embodiment, the internal circuit 30 functions as an output circuit that outputs a signal that is based on the operation of the integrated circuit device 1, and the terminal 13 functions as an output terminal that outputs the voltage signal Vo as a signal that is based on the operation of the integrated circuit device 1.

The electrostatic protection circuit 40 includes protection circuits 41, 42, and 43, and a diode 44. The diode 44 is provided between a discharge node 46 and the propagation node 21 that is electrically connected to the terminal 11. In other words, the discharge node 46 is electrically connected to the terminal 11 via the diode 44. Specifically, the anode of the diode 44 is electrically connected to the terminal 11, and the cathode is electrically connected to the discharge node 46. This diode 44 is an example of a first diode element.

One end of the protection circuit 41 is electrically connected to the propagation node 21 electrically connected to the terminal 11, and the other end is electrically connected to the propagation node 22 electrically connected to the terminal 12. In other words, the protection circuit 41 is electrically connected to the terminal 11 and the terminal 12. When a surge voltage such as an electrostatic voltage is input to the integrated circuit device 1, the protection circuit 41 limits the difference in potential between the terminal 11 and the terminal 12 to a predetermined value.

Note that the value of the difference in potential between the terminal 11 and the terminal 12 limited by the protection circuit 41 is set to a value that is larger than or equal to a maximum operation voltage of the integrated circuit device 1, and that is smaller than the sum of the smaller of the value of a voltage at which breakdown occurs in the transistor 301 of the internal circuit 30 and the value of a voltage at which breakdown occurs in a parasite diode included in the transistor 301 and the smaller of the value of a voltage at which breakdown occurs in the transistor 302 of the internal circuit 30 and the value of a voltage at which breakdown occurs in a parasite diode included in the transistor 302. Here, the protection circuit 41 may have any configuration that makes it possible to limit the difference in potential between the terminal 11 and the terminal 12 to the above-described range, and includes, for example, a diode whose anode is electrically connected to the terminal 12, and whose cathode is electrically connected to the terminal 11. This protection circuit 41 is an example of a first protection circuit.

One end of the protection circuit 42 is electrically connected to the discharge node 46, and the other end is electrically connected to the propagation node 23 electrically connected to the terminal 13. In other words, the protection circuit 42 is electrically connected to the discharge node 46 and the terminal 13. The protection circuit 42 operates when the difference in potential between the discharge node 46 and the propagation node 23 exceeds a predetermined value. As a result of the protection circuit 42 operating, the difference in potential between the discharge node 46 and the propagation node 23 is limited to the predetermined value. Here, the difference in potential between the discharge node 46 and the terminal 13 at which the protection circuit 42 operates is set to a value that is smaller than the voltage at which breakdown occurs in the transistor 301 of the internal circuit 30 and the voltage at which breakdown occurs in the parasite diode included in the transistor 301. This protection circuit 42 is an example of a second protection circuit.

One end of the protection circuit 43 is electrically connected to the discharge node 46, and the other end is electrically connected to the propagation node 22 electrically connected to the terminal 12. In other words, the protection circuit 43 is electrically connected to the discharge node 46 and the terminal 12. The protection circuit 43 operates when the difference in potential between the discharge node 46 and the propagation node 22 exceeds a predetermined value. As a result of the protection circuit 43 operating, the difference in potential between the potential of the discharge node 46 and the potential of the propagation node 22 is limited to the predetermined value. Here, the value of the difference in potential between the discharge node 46 and the terminal 12 at which the protection circuit 43 operates is a value that is smaller than the sum of the smaller of the value of the voltage at which breakdown occurs in the transistor 301 of the internal circuit 30 and the value of the voltage at which breakdown occurs in the parasite diode included in the transistor 301 and the smaller of the value of the voltage at which breakdown occurs in the transistor 302 of the internal circuit 30 and the value of the voltage at which breakdown occurs in the parasite diode included in the transistor 302, and that is smaller than the value of a voltage at which breakdown occurs in the diode 44. This protection circuit 43 is an example of a third protection circuit.

Configurations of Protection Circuits 42 and 43

Figure 2:
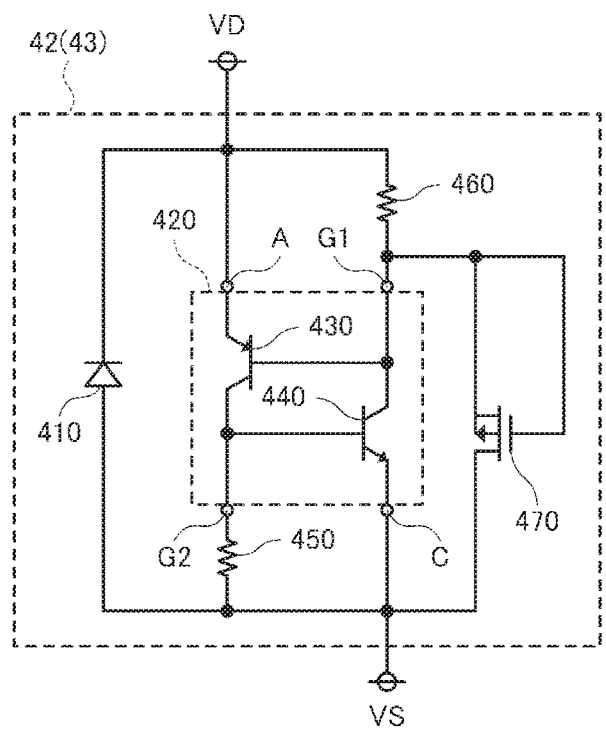
FIG. 2 is a diagram showing an example of the configuration of a protection circuit.

Next, an example of the configurations of the protection circuits 42 and 43 will be described with reference to FIG. 2. The protection circuit 42 and the protection circuit 43 are different only in the difference in potential at which the protection circuits 42 and 43 operate and the values of the differences in potential that are limited, and have similar configurations. Therefore, the configuration of the protection circuit 42 will be described as an example, and a description of the configuration of the protection circuit 43 is omitted. In addition, the terminal VD shown in FIG. 2 is equivalent to the terminal VD that is one end of each of the protection circuits 42 and 43 shown in FIG. 1, and the terminal VS shown in FIG. 2 is equivalent to the terminal VS that is the other end of each of the protection circuits 42 and 43 shown in FIG. 1. Accordingly, the protection circuit 42 is electrically connected to the discharge node 46 via the terminal VD, and is electrically connected to the propagation node 23 via the terminal VS. As a result of the protection circuit 42 operating, the difference in potential between the discharge node 46 and the terminal 13 is limited. Similarly, the protection circuit 43 is electrically connected to the discharge node 46 via the terminal VD, and is electrically connected to the propagation node 22 via the terminal VS. As a result of the protection circuit 43 operating, the difference in potential between the discharge node 46 and the terminal 12 is limited.

FIG. 2 is a diagram showing an example of the configuration of the protection circuit 42. As shown in FIG. 2, the protection circuit 42 includes a diode 410, a thyristor 420, resistors 450 and 460, and a transistor 470. Specifically, the protection circuit 42 includes the diode 410 whose anode is electrically connected to the terminal 13, and whose cathode is electrically connected to the discharge node 46, the thyristor 420 with an anode terminal A electrically connected to the discharge node 46 and a cathode terminal C electrically connected to the terminal 13, and the transistor 470 that is electrically connected to a first gate terminal G1 of the thyristor 420 and causes the thyristor 420 to operate.

To be specific, the anode of the diode 410 is electrically connected to the terminal VS, and the cathode of the diode 410 is electrically connected to the terminal VD. Accordingly, the anode of the diode 410 of the protection circuit 42 is electrically connected to the terminal 13, and the cathode of the diode 410 is electrically connected to the discharge node 46. This diode 410 included in the protection circuit 42 is an example of a second diode element.

The thyristor 420 includes a transistor 430 and a transistor 440. The transistor 430 is a PNP transistor, and the transistor 440 is an NPN transistor. The emitter of the transistor 430 is electrically connected to the anode terminal A of the thyristor 420. The base of the transistor 430 is electrically connected to the collector of the transistor 440 and the first gate terminal G1 of the thyristor 420. The collector of the transistor 430 is electrically connected to the base of the transistor 440 and a second gate terminal G2 of the thyristor 420. The emitter of the transistor 440 is electrically connected to the cathode terminal C of the thyristor 420.

Also, the anode terminal A of the thyristor 420 is electrically connected to the terminal VD, and the cathode terminal C of the thyristor 420 is electrically connected to the terminal VS.

As described above, the anode terminal A is electrically connected to the discharge node 46, and the cathode terminal C of the thyristor 420 is electrically connected to the terminal 13. The thyristor 420 included in the protection circuit 42 is an example of a thyristor element.

One end of the resistor 450 is electrically connected to the second gate terminal G2 of the thyristor 420, and the other end is electrically connected to the terminal VS. In addition, one end of the resistor 460 is electrically connected to the first gate terminal G1 of the thyristor 420, and the other end is electrically connected to the terminal VD.

The gate and the source of the transistor 470 are electrically connected to the first gate terminal G1 of the thyristor 420, and the drain is electrically connected to the terminal VS. Note that a description will be given assuming that the transistor 470 according to this embodiment is a P-channel MOS transistor. Although a detailed description will be given later, this transistor 470 is an example of a trigger element that causes the thyristor 420 to operate.

Here, in the following description, a path extending from the terminal VS toward the terminal VD may be referred to as a "forward path" in the protection circuit 42 or 43, and a path extending from the terminal VD toward the terminal VS may be referred to as a "reverse path" in the protection circuit 42 or 43, in accordance with the orientation of the diode 410 included in each of the protection circuits 42 and 43. Also, in each of the protection circuits 42 and 43, the difference in potential between the terminal VS and the terminal VD on the forward path may be referred to as a "forward voltage" of the protection circuit 42 or 43, and the difference in potential between the terminal VD and the terminal VS on the reverse path may be referred to as a "reverse voltage" of the protection circuit 42 or 43.

Operations of Electrostatic Protection Circuit

Operations of the electrostatic protection circuit 40 when a surge voltage such as an electrostatic voltage is applied to the integrated circuit device 1 configured as described above will be described with reference to FIGS. 3 to 8.

When no surge voltage is applied to the integrated circuit device 1, the voltage signal Vdd input from the terminal 11 propagates to the propagation node 21 of the integrated circuit device 1, and the voltage signal Vss input from the terminal 12 propagates to the propagation node 22. Therefore, the potential of the discharge node 46 when no surge voltage is applied to the integrated circuit device 1 takes a value obtained by subtracting the forward voltage of the diode 44 from the potential of the voltage signal Vdd propagated in the propagation node 21.

Figure 3:
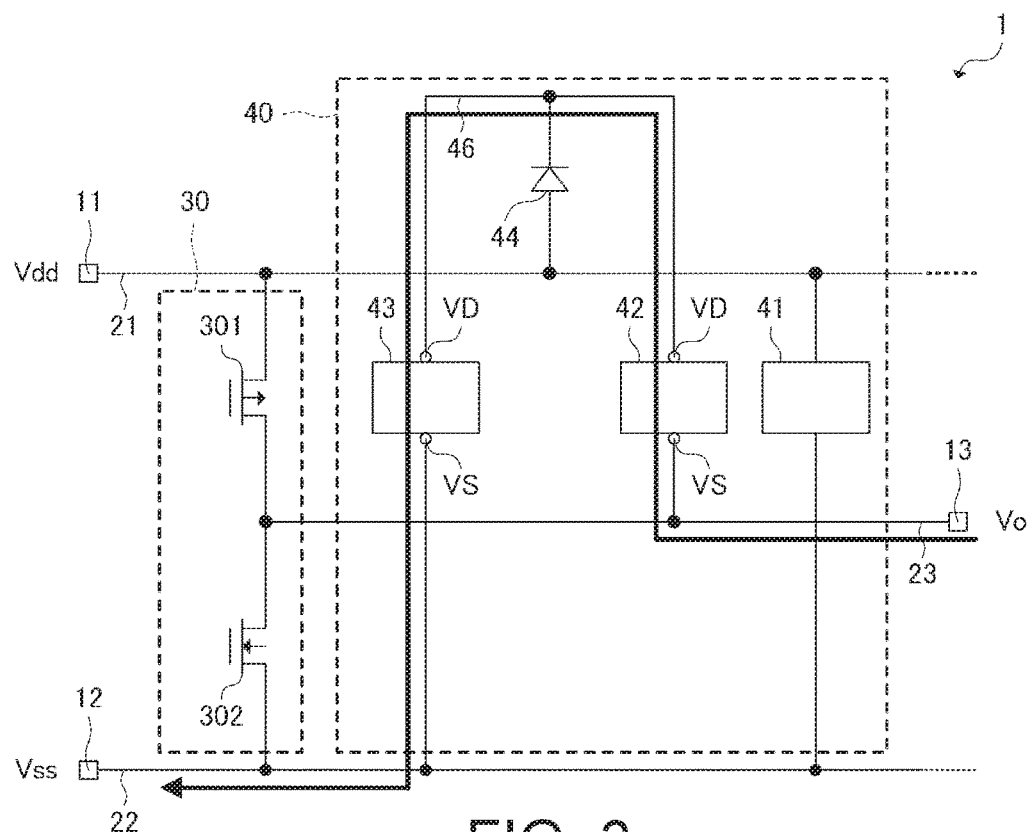
FIG. 3 is a diagram for illustrating a path through which a current caused by a positive surge voltage flows, the positive surge voltage having been generated in a terminal 13, when the potential of a voltage signal Vss that is input to a terminal 12 is a ground potential.

FIG. 3 is a diagram for illustrating a path through which a current caused by a positive surge voltage flows, the positive surge voltage having been applied to the terminal 13 when the potential of the voltage signal Vss that is input to the terminal 12 is a ground potential. If a positive surge voltage whose potential is sufficiently larger than the voltage signal Vdd is applied to the terminal 13 when the potential of the voltage signal Vss that is input to the terminal 12 is a ground potential, a current caused by the surge voltage flows via the forward path of the protection circuit 42 and the reverse path of the protection circuit 43 in a direction from the terminal 13 toward the terminal 12. Therefore, the potential of the terminal 13 is determined based on the sum of the forward voltage of the protection circuit 42 and the reverse voltage of the protection circuit 43, and the potential of the discharge node 46 is determined based on the value of the reverse voltage of the protection circuit 43. Therefore, the internal circuit 30 can be protected by making the sum of the forward voltage of the protection circuit 42 and the reverse voltage of the protection circuit 43 smaller than the breakdown voltages of the transistors 301 and 302.

Figure 4:
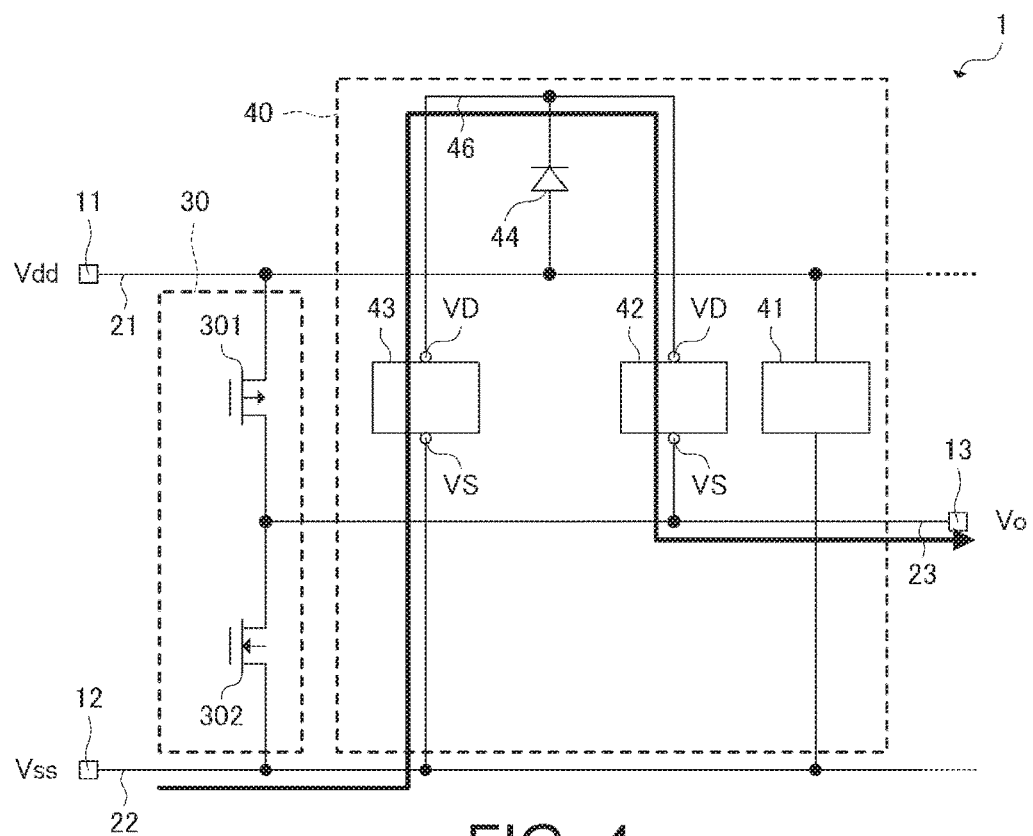
FIG. 4 is a diagram for illustrating a path through which a current caused by a negative surge voltage flows, the negative surge voltage having been generated in the terminal 13, when the potential of the voltage signal Vss that is input to the terminal 12 is a ground potential.

FIG. 4 is a diagram for illustrating a path through which a current caused by a negative surge voltage flows, the negative surge voltage having been applied to the terminal 13 when the potential of the voltage signal Vss that is input to the terminal 12 is a ground potential. If a negative surge voltage whose potential is sufficiently smaller than the voltage signal Vss is applied to the terminal 13 when the potential of the voltage signal Vss that is input to the terminal 12 is a ground potential, a current caused by the surge voltage flows via the forward path of the protection circuit 43 and the reverse path of the protection circuit 42 in a direction from the terminal 12 toward the terminal 13. Therefore, the potential of the terminal 13 is determined based on the sum of the forward voltage of the protection circuit 43 and the reverse voltage of the protection circuit 42, and the potential of the discharge node 46 is determined based on the value of the reverse voltage of the protection circuit 43. Therefore, the internal circuit 30 can be protected by making the sum of the forward voltage of the protection circuit 43 and the reverse voltage of the protection circuit 42 smaller than the breakdown voltages of the transistors 301 and 302.

Figure 5:
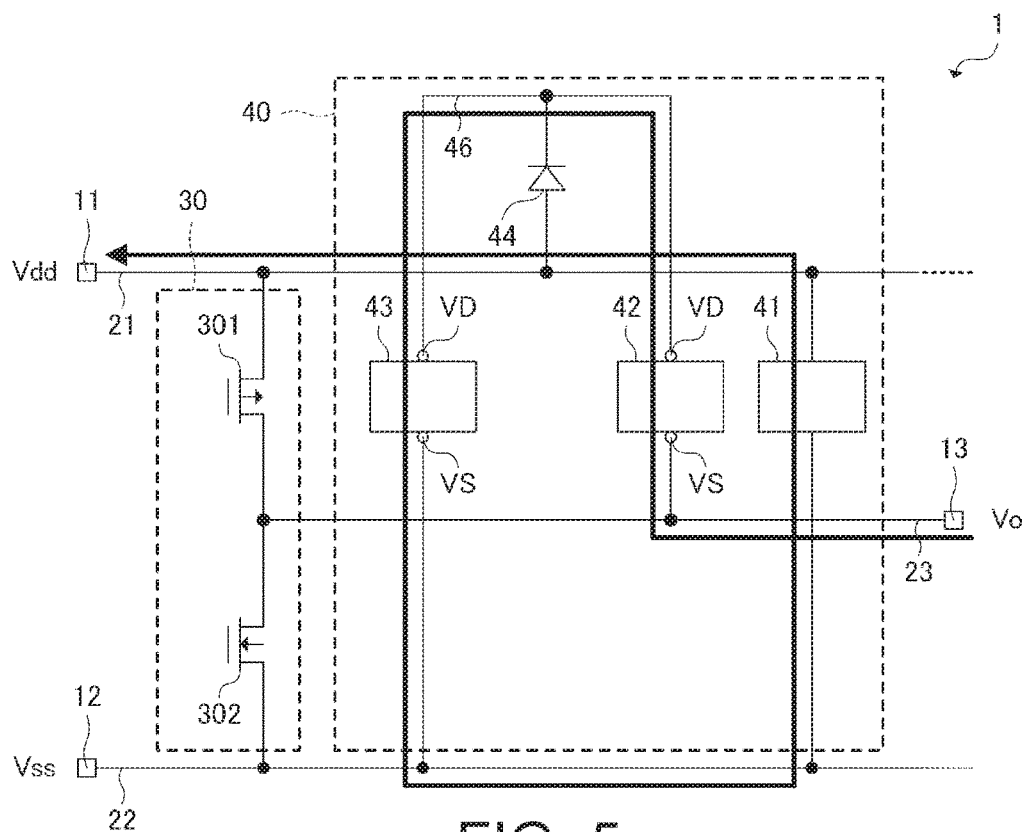
FIG. 5 is a diagram for illustrating a path through which a current caused by a positive surge voltage flows, the positive surge voltage having been generated in the terminal 13, when the potential of a voltage signal Vdd that is input to the terminal 11 is a ground potential.

FIG. 5 is a diagram for illustrating a path through which a current caused by a positive surge voltage flows, the positive surge voltage having been applied to the terminal 13 when the potential of the voltage signal Vdd that is input to the terminal 11 is a ground potential. If a positive surge voltage whose potential is sufficiently larger than the voltage signal Vdd is applied to the terminal 13 when the potential of the voltage signal Vdd that is input to the terminal 11 is a ground potential, a current caused by the surge voltage flows via the forward path of the protection circuit 42, the reverse path of the protection circuit 43, and the forward path of the protection circuit 41 in a direction from the terminal 13 toward the terminal 11. Therefore, the potential of the terminal 13 is determined based on the sum of the forward voltage of the protection circuit 42, the reverse voltage of the protection circuit 43, and the forward voltage of the protection circuit 41, and the potential of the discharge node 46 is determined based on the sum of the reverse voltage of the protection circuit 43 and the forward voltage of the protection circuit 41. Therefore, the internal circuit 30 can be protected by making the sum of the forward voltage of the protection circuit 42, the reverse voltage of the protection circuit 43, and the forward voltage of the protection circuit 41 smaller than the breakdown voltages of the transistors 301 and 302.

Figure 6:
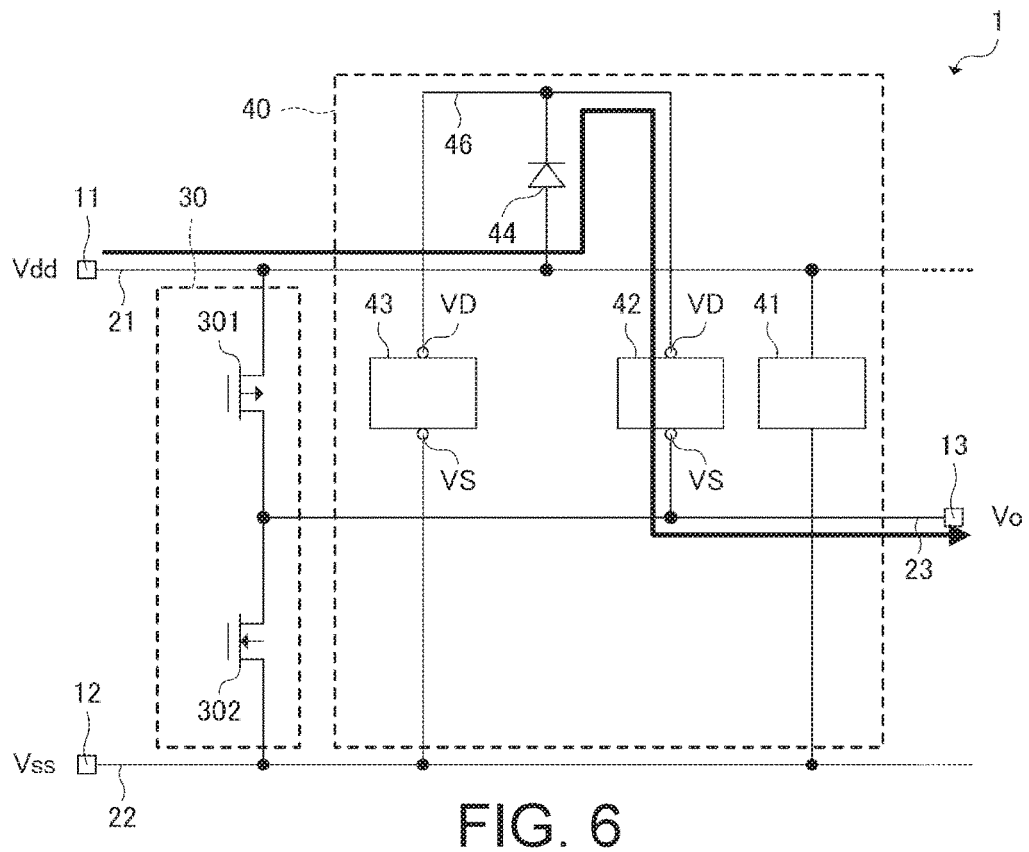
FIG. 6 is a diagram for illustrating a path through which a current caused by a negative surge voltage flows, the negative surge voltage having been generated in the terminal 13, when the potential of the voltage signal Vdd that is input to the terminal 11 is a ground potential.

FIG. 6 is a diagram for illustrating a path through which a current caused by a negative surge voltage flows, the negative surge voltage having been applied to the terminal 13 when the potential of the voltage signal Vdd that is input to the terminal 11 is a ground potential. If a negative surge voltage whose potential is sufficiently smaller than the voltage signal Vss is applied to the terminal 13 when the potential of the voltage signal Vdd that is input to the terminal 11 is a ground potential, a current caused by the surge voltage flows via the forward path of the diode 44 and the reverse path of the protection circuit 42 in a direction from the terminal 11 toward the terminal 13. Therefore, the potential of the terminal 13 is determined based on the sum of the forward voltage of the diode 44 and the reverse voltage of the protection circuit 42. Therefore, the internal circuit 30 can be protected by making the sum of the forward voltage of the diode 44 and the reverse voltage of the protection circuit 42 smaller than the breakdown voltages of the transistors 301 and 302.

Figure 7:
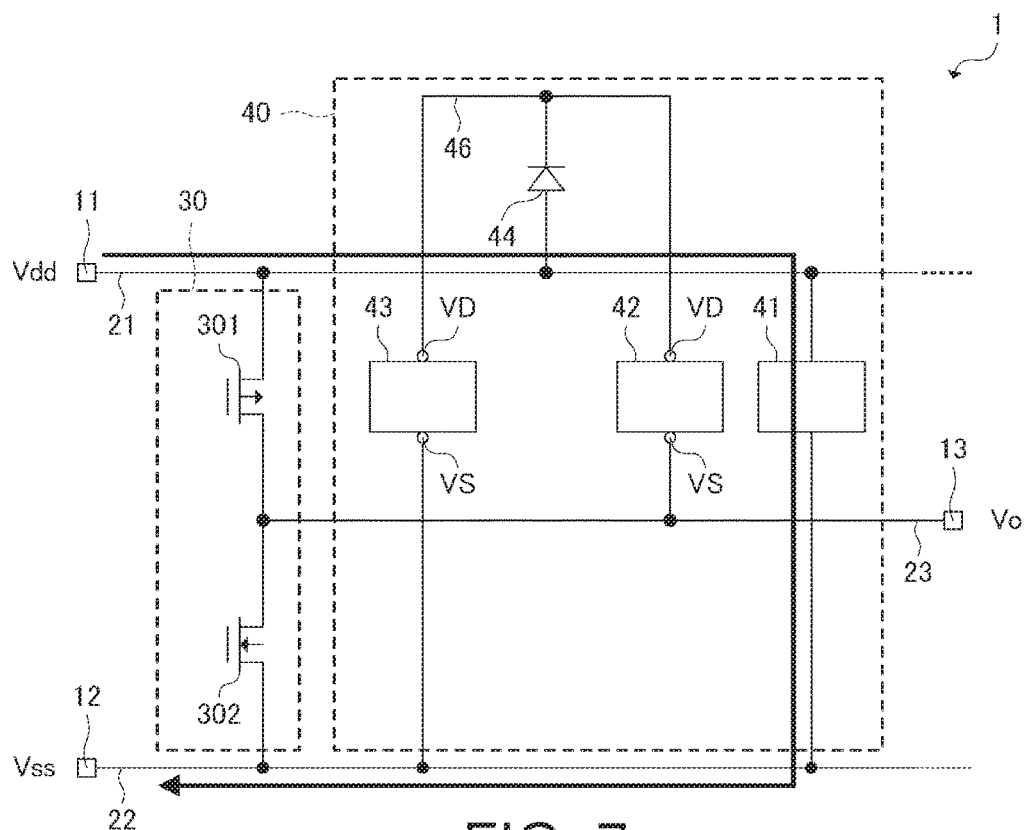
FIG. 7 is a diagram for illustrating a path through which a current caused by a positive surge voltage flows, the positive surge voltage having been generated in the terminal 11, when the potential of the voltage signal Vss that is input to the terminal 12 is a ground potential.

FIG. 7 is a diagram for illustrating a path through which a current caused by a positive surge voltage flows, the positive surge voltage having been applied to the terminal 11 when the potential of the voltage signal Vss that is input to the terminal 12 is a ground potential. If a positive surge voltage whose potential is sufficiently larger than the voltage signal Vdd is applied to the terminal 11 when the potential of the voltage signal Vss that is input to the terminal 12 is a ground potential, a current caused by the surge voltage flows via the reverse path of the protection circuit 41 in a direction from the terminal 11 toward the terminal 12. Therefore, the potential of the terminal 11 is determined based on the reverse voltage of the protection circuit 41. Therefore, the internal circuit 30 can be protected by making the reverse voltage of the protection circuit 41 smaller than the breakdown voltages of the transistors 301 and 302.

Figure 8:
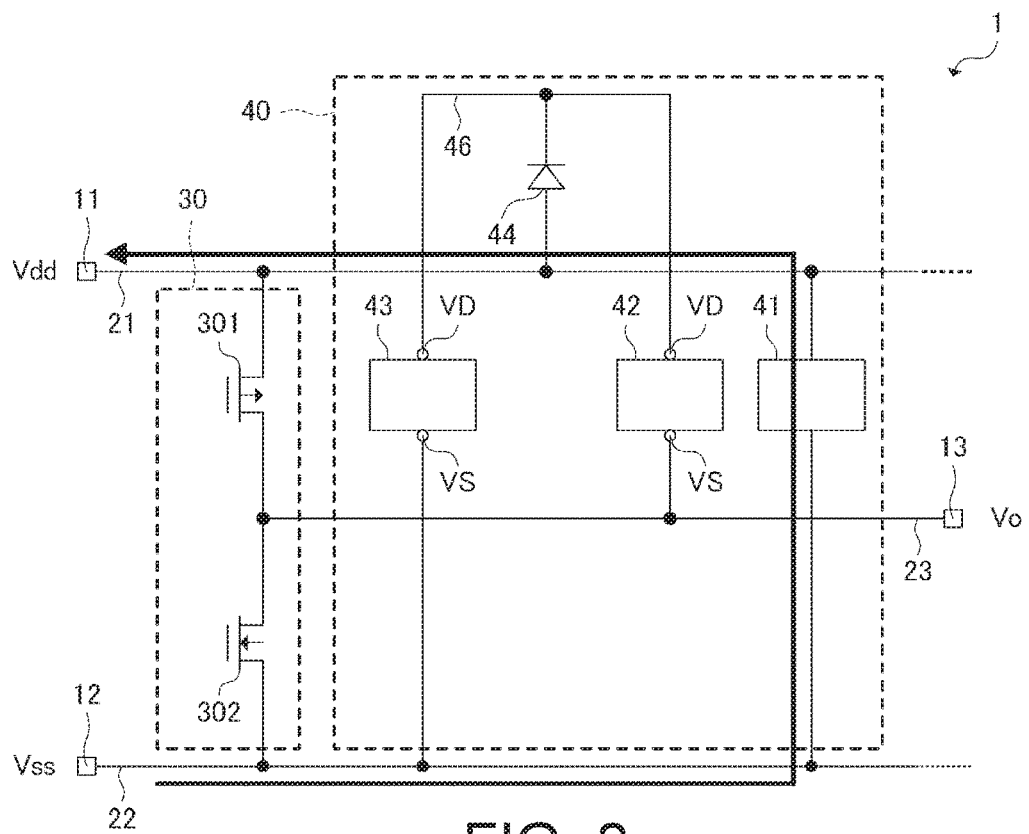
FIG. 8 is a diagram for illustrating a path through which a current caused by a negative surge voltage flows, the negative surge voltage having been generated in the terminal 11, when the potential of the voltage signal Vss that is input to the terminal 12 is a ground potential.

FIG. 8 is a diagram for illustrating a path through which a current caused by a negative surge voltage flows, the negative surge voltage having been applied to the terminal 11 when the potential of the voltage signal Vss that is input to the terminal 12 is a ground potential. If a negative surge voltage whose potential is sufficiently smaller than the voltage signal Vss is applied to the terminal 11 when the potential of the voltage signal Vss that is input to the terminal 12 is a ground potential, a current caused by the surge voltage flows via the forward path of the protection circuit 41 in a direction from the terminal 12 toward the terminal 11. Therefore, the potential of the terminal 12 is determined based on the forward voltage of the protection circuit 41. Therefore, the internal circuit 30 can be protected by making the forward voltage of the protection circuit 41 smaller than the breakdown voltages of the transistors 301 and 302.

Figure 9:
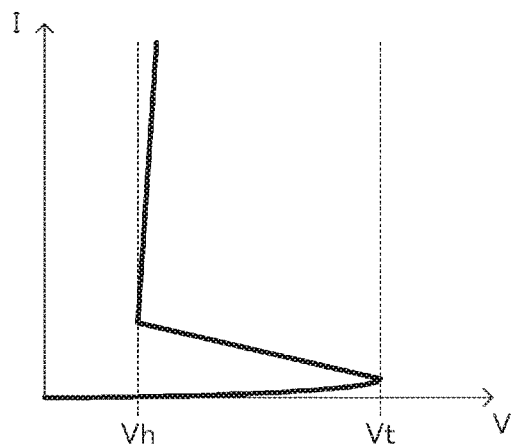
FIG. 9 is a diagram showing the relationship between a current that flows in a protection circuit and the difference in potential between a terminal VD and a terminal VS.

Here, operations of the protection circuits 42 and 43 shown in FIG. 2 will be described with reference to FIGS. 2 and 9. Note that, as described above, the protection circuits 42 and 43 have similar configurations, and the protection circuit 42 will be described below as a representative, and a description of the protection circuit 43 is omitted. FIG. 9 is a diagram showing the relationship between a current that flows in the protection circuit 42 and the difference in potential between the terminal VD and the terminal VS when the protection circuit 42 operates.

In the protection circuit 42, when the difference between the potential of the discharge node 46 electrically connected to the terminal VD and the potential of the propagation node 23 electrically connected to the terminal VS exceeds a voltage Vt that is a voltage at which breakdown occurs in the transistor 470, the source and the drain of the transistor 470 are electrically connected. Accordingly, a signal that is based on the potential of the propagation node 23 is input to the first gate terminal G1 of the thyristor 420. As a result, control is performed so as to switch on the thyristor 420. In other words, the transistor 470 causes the thyristor 420 to operate. This voltage Vt, which is a voltage at which breakdown occurs in the transistor 470, is equivalent to a trigger voltage for controlling the thyristor 420 to be conductive. Note that, when calculating the above-mentioned voltage, of course, voltage drops in the resistors 450 and 460 need to be taken into consideration, but a description thereof is omitted in the present specification in order to avoid a complicated description.

In addition, due to control being performed so as to switch on the thyristor 420, the difference in potential between the anode terminal A and the cathode terminal C of the thyristor 420 reaches the sum of a threshold voltage of the transistor 430 and a threshold voltage of the transistor 440. Specifically, the difference in potential between the discharge node 46 electrically connected to the anode terminal A of the thyristor 420 and the propagation node 23 electrically connected to the cathode terminal C of the thyristor 420 is limited based on a voltage Vh that is equivalent to the sum of the threshold voltage of the transistor 430 and the threshold voltage of the transistor 440. This voltage Vh is equivalent to a clamp voltage of the protection circuit 42.

As described above, in the protection circuit 42, the thyristor 420 operates as a result of the difference in potential between the terminal VD and the terminal VS exceeding the voltage Vt. As a result of the thyristor 420 operating, the potential between the terminal VD and the terminal VS is limited based on the voltage Vh. In other words, the protection circuit 42 limits the potential between the terminal VD and the terminal VS based on the voltage Vh whose potential is lower than that of the voltage Vt for starting a protection operation. Accordingly, it is possible to decrease the value to which a voltage is limited by the protection circuit 42, and to mitigate a risk that voltage stress will occur in the internal circuit 30 due to the voltage Vh to which a voltage is limited by the protection circuit 42.

Here, the configurations of the diode 410, the transistor 470, and the thyristor 420 that constitute the protection circuit 42 will be described in detail with reference to FIGS. 10 to 12.

Figure 10:
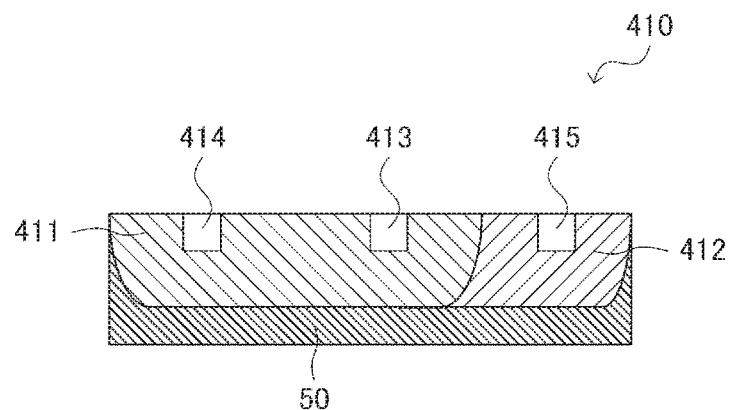
FIG. 10 is a cross-sectional diagram showing the configuration of a diode.

FIG. 10 is a cross-sectional diagram showing the configuration of the diode 410. As shown in FIG. 10, the diode 410 includes a p-type semiconductor substrate 50, an n-well region 411 obtained by adding impurities to the semiconductor substrate 50, and a p-well region 412 obtained by adding impurities to the semiconductor substrate 50.

An n-region 413 that functions as the cathode of the diode 410 and a p-region 414 that functions as the anode of the diode 410 are formed in the n-well region 411. Also, a p-region 415 to which the voltage signal Vss for determining the potential of the semiconductor substrate 50 is applied is formed in the p-well region 412.

In the diode 410 configured as described above, the n-region 413 and the p-region 414 are separated from the p-region 415 by a parasite diode formed by the n-well region 411 and the p-well region 412. Therefore, even when the potential of the p-region 414 that functions as the anode of the diode 410 decreases below the potential of the voltage signal Vss, a risk that the potential of the voltage signal Vss will decrease is mitigated.

Figure 11:
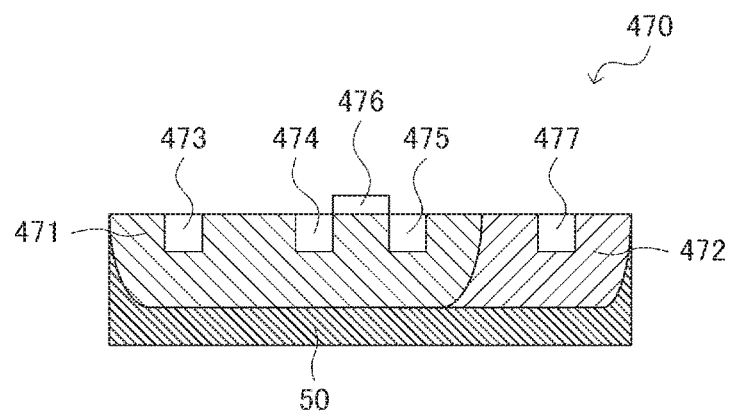
FIG. 11 is a cross-sectional diagram showing the configuration of a transistor.

FIG. 11 is a cross-sectional diagram showing the configuration of the transistor 470. As shown in FIG. 11, the transistor 470 includes the p-type semiconductor substrate 50, an n-well region 471 obtained by adding impurities to the semiconductor substrate 50, and a p-well region 472 obtained by adding impurities to the semiconductor substrate 50.

An n-region 473 that functions as a back gate of the transistor 470, a p-region 474 that functions as the source of the transistor 470, and a p-region 475 that functions as the drain of the transistor 470 are formed in the n-well region 471. In addition, an n-region 476 that functions as the gate of the transistor 470 is layered so as to at least partially overlap the p-region 474 and the p-region 475 via an insulator (not illustrated). In addition, a p-region 477 to which the voltage signal Vss for determining the potential of the semiconductor substrate 50 is applied is formed in the p-well region 472.

In the transistor 470 configured as described above, the n-region 473, the p-region 474, and the n-region 476 are separated from the p-region 477 by a parasite diode formed by the n-well region 471 and the p-well region 472. Therefore, even when the potential in the n-region 473 that functions as the back gate, the p-region 474 that functions as the source of the transistor 470, or the n-region 476 that functions as the gate of the transistor 470 decreases to a potential that is lower than that of the voltage signal Vss, the risk that the potential of the voltage signal Vss will decrease is mitigated.

Figure 12:
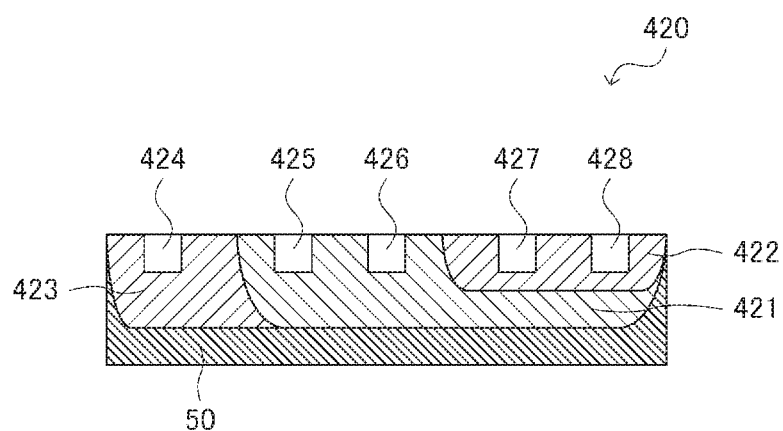
FIG. 12 is a cross-sectional diagram showing the configuration of a thyristor.

FIG. 12 is a cross-sectional diagram showing the configuration of the thyristor 420. As shown in FIG. 12, the thyristor 420 includes the p-type semiconductor substrate 50, an n-well region 421 obtained by adding impurities to the semiconductor substrate 50, a p-well region 422 formed in the n-well region 421, and a p-well region 423 obtained by adding impurities to the semiconductor substrate 50.

An n-region 425 that functions as a first gate of the thyristor 420 and a p-region 426 that functions as the anode terminal A of the thyristor 420 are formed in the n-well region 421. In addition, an n-region 427 that functions as the cathode terminal C of the thyristor 420 and a p-region 428 that functions as a second gate of the thyristor 420 are formed in the p-well region 422. In other words, the thyristor 420 is formed by the n-region 425 and the p-region 426 formed in the n-well region 421 and the n-region 427 and the p-region 428 formed in the p-well region 422. In addition, a p-region 424 to which the voltage signal Vss for determining the potential of the semiconductor substrate 50 is applied is formed in the p-well region 423. Here, the n-well region 421 is an example of a first impurity-doped region, and the p-well region 422 is an example of a second impurity-doped region.

In the thyristor 420 configured as described above, the p-well region 422 and the p-well region 423 are separated by the n-well region 421. Therefore, even when the potential of the n-region 427 that functions as the cathode terminal C of the thyristor 420 decreases below the potential of the voltage signal Vss, the risk that the potential of the voltage signal Vss will decrease is mitigated.

In the protection circuit 42 that includes the diode 410, the transistor 470, and the thyristor 420 configured as described above, a parasite diode in which the terminal VD functions as a cathode and the terminal VS functions as an anode is not formed. Therefore, the risk that the potential of the terminal 12 to which the voltage signal Vss is supplied will decrease, when a negative surge voltage is supplied to the terminal VD, is further mitigated.

Here, the semiconductor substrate 50 on which the diode 410, the transistor 470, and the thyristor 420 are formed is an example of a substrate.

In addition, it suffices for the transistor 470 of the protection circuit 42 to be configured such that breakdown occurs at any value, and may also be, for example, a diode element, a PNP bipolar transistor element, a GGnMOS transistor element, or an NPN bipolar transistor element.

Actions and Effects

As described above, the electrostatic protection circuit 40 according to this embodiment includes the diode 44 whose anode is electrically connected to the terminal 11, and whose cathode is electrically connected to the discharge node 46, the protection circuit 41 electrically connected to the terminal 11 and the terminal 12, the protection circuit 42 electrically connected to the discharge node 46 and the terminal 13, and the protection circuit 43 electrically connected to the discharge node 46 and the terminal 12. In the electrostatic protection circuit 40 configured as described above, it is possible to control the forward voltage and reverse voltage of each of the protection circuit 41, the protection circuit 42, and the protection circuit 43, and, even when a surge voltage is applied to one of the terminal 11, the terminal 12, and the terminal 13, it is possible to mitigate the risk that the internal circuit 30 will malfunction due to a surge voltage, and a limit value of a surge voltage can be set for each of the terminal 11, the terminal 12, and the terminal 13.

In addition, even if a surge voltage is applied to the terminal 13, the propagation node 21 electrically connected to the terminal 11 and the propagation node 23 electrically connected to the terminal 13 are not directly electrically connected via an element such as a diode since the electrostatic protection circuit 40 includes the discharge node 46, and the risk that the surge voltage applied to the terminal 13 will affect the voltage signal Vdd propagated to the terminal 11 is mitigated. Similarly, even if a surge voltage is applied to the terminal 13, the propagation node 22 electrically connected to the terminal 12 and the propagation node 23 electrically connected to the terminal 13 are not directly electrically connected via an element such as a diode, and, therefore, the risk that the surge voltage applied to the terminal 13 will affect the voltage signal Vss propagated to the terminal 12 is mitigated.

As described above, in the electrostatic protection circuit 40 according to this embodiment, even if the waveform and value of a surge voltage that is applied to the integrated circuit device 1 is different from those in a conventionally used potential protection circuit, it is possible to mitigate the influence of the surge voltage on the internal circuit.

2. Second Embodiment

Next, an integrated circuit device 1 provided with an electrostatic protection circuit 40 according to a second embodiment will be described. In the integrated circuit device 1 provided with the electrostatic protection circuit 40 according to the second embodiment, the configurations of protection circuits 42 and 43 of the electrostatic protection circuit 40 are different from those in the first embodiment. Note that the protection circuits 42 and 43 according to the second embodiment have similar configurations, and are different only in the value of the difference in potential at which the protection circuits 42 and 43 operate and the values of the differences in potential that are limited. Therefore, regarding the integrated circuit device 1 according to the second embodiment, the configuration of the protection circuit 42 will be described as an example, and a description of the configuration of the protection circuit 43 is omitted.

Figure 13:
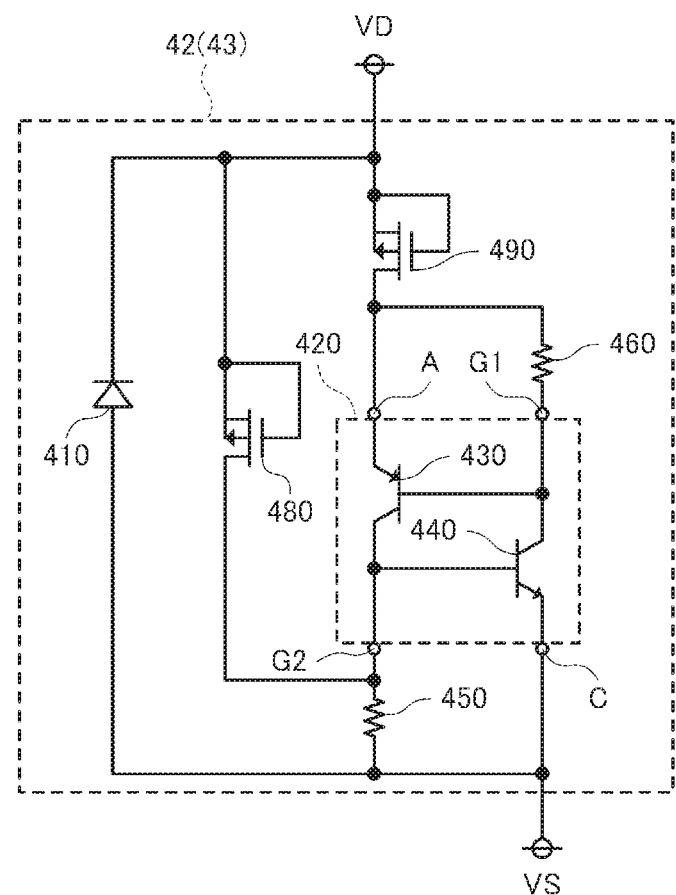
FIG. 13 is a diagram showing the configuration of a protection circuit according to a second embodiment.

FIG. 13 is a diagram showing the configuration of the protection circuit 42 according to the second embodiment. As shown in FIG. 13, the protection circuit 42 according to the second embodiment includes a diode 410, a thyristor 420, resistors 450 and 460, and transistors 480 and 490. Specifically, the protection circuit 42 includes the diode 410 whose anode is electrically connected to the terminal 13, and whose cathode is electrically connected to the terminal 11, the thyristor 420 with a cathode terminal C electrically connected to the terminal 13, the transistor 490 electrically connected to an anode terminal A of the thyristor 420, and the transistor 480 that is electrically connected to a second gate terminal G2 of the thyristor 420, and causes the thyristor 420 to operate.

To be specific, the anode of the diode 410 is electrically connected to the terminal 13 via the terminal VS and the propagation node 23, and the cathode of the diode 410 is electrically connected to the terminal 11 via the terminal VD and the propagation node 21. This diode 410 included in the protection circuit 42 is an example of a second diode element.

The thyristor 420 includes transistors 430 and 440. The transistor 430 is a PNP transistor, and the transistor 440 is an NPN transistor. The emitter of the transistor 430 is electrically connected to the anode terminal A of the thyristor 420. The base of the transistor 430 is electrically connected to the collector of the transistor 440 and a first gate terminal G1 of the thyristor 420. The collector of the transistor 430 is electrically connected to the base of the transistor 440 and the second gate terminal G2 of the thyristor 420. The emitter of the transistor 440 is electrically connected to the cathode terminal C of the thyristor 420. Also, the cathode terminal C of the thyristor 420 is electrically connected to the terminal VS of the protection circuit 42.

When a signal for causing the thyristor 420 to operate is input to the first gate terminal G1 or the second gate terminal G2, control is performed so as to switch on the thyristor 420 configured as described above. This thyristor 420 included in the protection circuit 42 is an example of a thyristor element, the anode terminal A is an example of the anode of the thyristor 420, the cathode terminal C is an example of the cathode of the thyristor 420, and the second gate terminal G2 is an example of the gate of the thyristor 420.

One end of the resistor 450 is electrically connected to the second gate terminal G2 of the thyristor 420, and the other end is electrically connected to the terminal VS. Also, one end of the resistor 460 is electrically connected to the anode terminal A of the thyristor 420, and the other end is electrically connected to the first gate terminal G1 of the thyristor 420.

The gate and source of the transistor 480 are electrically connected to the terminal VD, and the drain of the transistor 480 is electrically connected to the second gate terminal G2 of the thyristor 420. Also, the gate and source of the transistor 490 are electrically connected to the terminal VD, and the drain of the transistor 490 is electrically connected to the anode terminal A of the thyristor 420. Note that a description will be given assuming that the transistors 480 and 490 according to this embodiment are P-channel MOS transistors. Here, the transistor 480 included in the protection circuit 42 is an example of a trigger element, and the transistor 490 is an example of a voltage limiting element.

In the protection circuit 42 configured as described above, when the value of a voltage applied to the source and gate of the transistor 480 exceeds a voltage at which breakdown occurs in the transistor 480, control is performed so as to switch on the thyristor 420. Accordingly, the difference in potential between the anode terminal A and the cathode terminal C of the thyristor 420 is limited based on the sum of a threshold voltage of the transistor 430 and a threshold voltage of the transistor 440. In addition, the sum of the difference in potential between the anode terminal A and the cathode terminal C of the thyristor 420 when the thyristor 420 is operating and a voltage at which breakdown occurs in the transistor 490 is adjusted to be larger than or equal to the absolute maximum rating of the integrated circuit device 1 and smaller than or equal to the breakdown voltages of the transistors 301 and 302 of the internal circuit 30, by controlling the voltage value at which breakdown occurs in the transistor 490.

Accordingly, in the protection circuit 42 according to the second embodiment, it is possible to adjust the difference in potential between the terminal VD and the terminal VS that is limited by the protection circuit 42 by adjusting the voltage value at which breakdown occurs in the transistor 490. Therefore, the value to which a voltage is limited in the electrostatic protection circuit 40 can be set to an optimum value based on the voltage value at which breakdown occurs in the transistor 490, and it is possible to realize a more versatile electrostatic protection circuit 40.

Furthermore, a detailed configuration of the diode 410 is similar to that in the example shown in FIG. 10, a detailed configuration of the transistors 480 and 490 is similar to that in the example shown in FIG. 11, a detailed configuration of the thyristor 420 is similar to that in the example shown in FIG. 12, and, as a result, it is possible to obtain actions and effects similar to those of the electrostatic protection circuit 40 according to the first embodiment.

In addition, it suffices for the transistors 480 and 490 of the protection circuit 42 to be configured such that breakdown occurs at any value, and each of the transistors 480 and 490 may also be, for example, a diode element, a PNP bipolar transistor element, a GGnMOS transistor element, or an NPN bipolar transistor element.

3. Third Embodiment

Figure 14:
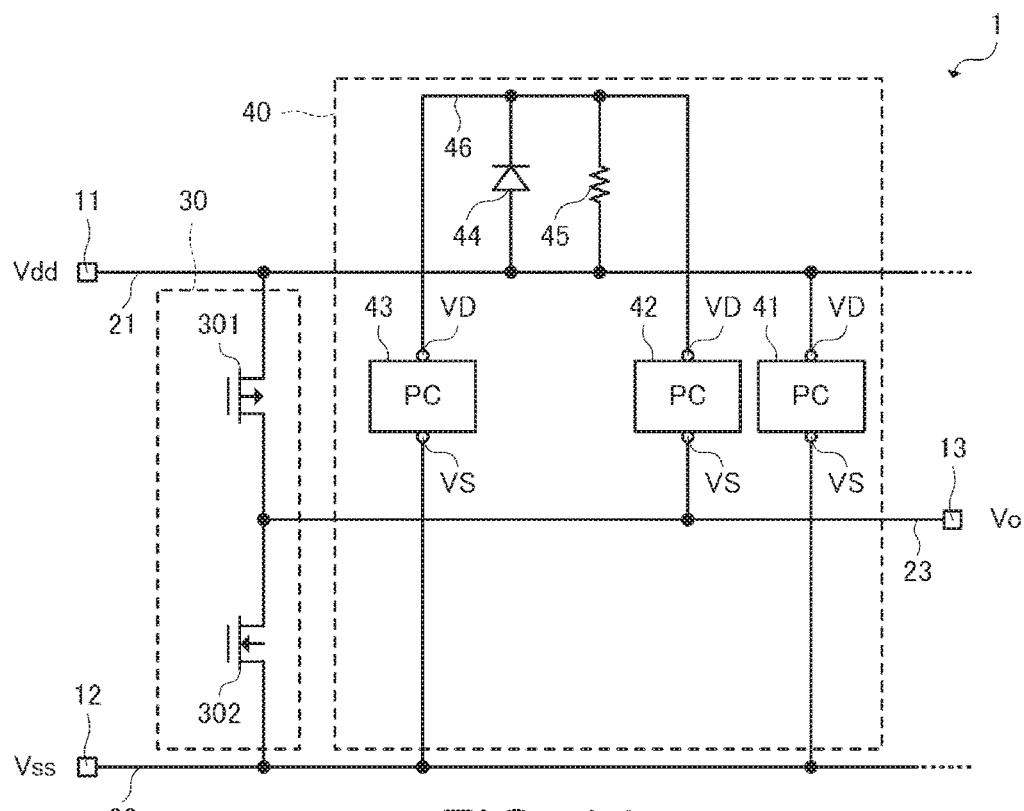
FIG. 14 is a diagram showing the configuration of an integrated circuit device 1 according to a third embodiment.

Next, an integrated circuit device 1 provided with an electrostatic protection circuit 40 according to a third embodiment will be described. FIG. 14 is a diagram showing the configuration of the integrated circuit device 1 according to the third embodiment. As shown in FIG. 14, the integrated circuit device 1 provided with the electrostatic protection circuit 40 according to the third embodiment is different from the electrostatic protection circuits 40 according to the first and second embodiments, in that a resistor 45 is provided between the discharge node 46 and the propagation node 21, in parallel with the diode 44. In other words, the electrostatic protection circuit 40 according to the third embodiment includes a resistor 45 whose one end is electrically connected to the terminal 11 via the propagation node 21, and other end is electrically connected to the discharge node 46. This resistor 45 is an example of a first resistive element.

In the integrated circuit device 1 provided with the electrostatic protection circuit 40, there are cases where an unintended parasite transistor is formed in accordance with the arrangement and structure of various constituent elements formed in the integrated circuit device 1. There is a risk of an unintended current path being formed between the discharge node 46 and the propagation node 21 due to such an unintended parasite transistor.

Since the resistor 45 is provided between the discharge node 46 and the propagation node 21 and in parallel with the diode 44, the potential of the discharge node 46 can be controlled based on the potential of the propagation node 21, and, even when an unintended current path is generated between the discharge node 46 and the propagation node 21, the potential of the discharge node 46 is stabilized. Accordingly, it is possible to further mitigate the risk that the integrated circuit device 1 will malfunction.

4. Fourth Embodiment

Figure 15:
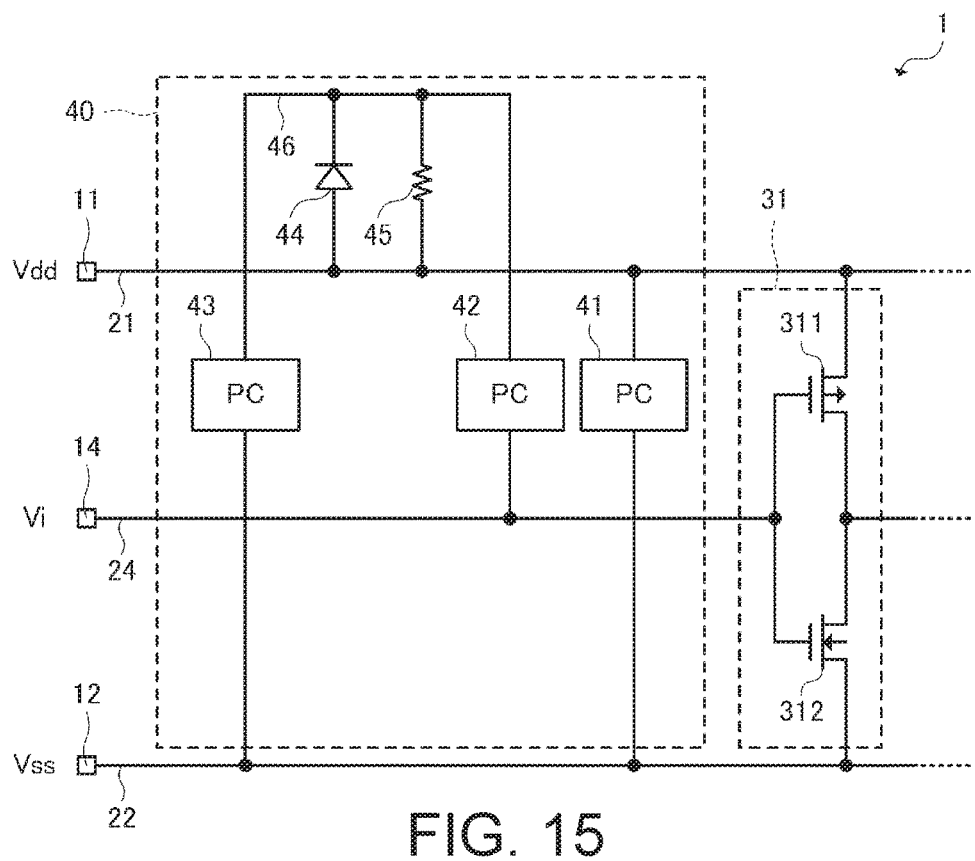
FIG. 15 is a diagram showing the configuration of an integrated circuit device 1 according to a fourth embodiment.

Next, an integrated circuit device 1 provided with an electrostatic protection circuit 40 according to a fourth embodiment will be described. FIG. 15 is a diagram showing the configuration of the integrated circuit device 1 according to the fourth embodiment. The electrostatic protection circuit 40 according to the fourth embodiment is different from those of the integrated circuit devices 1 according to the first to third embodiments, in that the electrostatic protection circuit 40 according to the fourth embodiment mitigates the influence of a surge voltage on an internal circuit 31 that operates based on a signal input from a terminal 14 that inputs various signals to the integrated circuit device 1. Note that the integrated circuit device 1 according to the third embodiment that includes the resistor 45 between the discharge node 46 and the propagation node 21 will be described as an example with reference to FIG. 15, but the integrated circuit device 1 according to the first or second embodiment that does not include the resistor 45 between the discharge node 46 and the propagation node 21 may also be used.

FIG. 15 is a diagram showing the configuration of the integrated circuit device 1 provided with the electrostatic protection circuit 40 according to the fourth embodiment. As shown in FIG. 15, the integrated circuit device 1 includes the terminals 11, 12, and 14, the internal circuit 31, and the electrostatic protection circuit 40. In the integrated circuit device 1 according to the fourth embodiment, various constituent elements of the integrated circuit device 1 that include the internal circuit 31 operate based on the difference in potential between the voltage signal Vdd that is input to the terminal 11 and the voltage signal Vss whose potential is lower than that of the voltage signal Vdd, and that is input to the terminal 12. Such various constituent elements included in the integrated circuit device 1 operate based on a voltage signal Vi that is input from the terminal 14. The electrostatic protection circuit 40 is electrically connected to the terminal 11 to which the voltage signal Vdd is input, the terminal 12 to which the voltage signal Vss whose potential is lower than that of the voltage signal Vdd is input, and the terminal 14 that is connected to an external circuit of the integrated circuit device 1, and mitigates the influence of a surge voltage on the internal circuit 31.

The internal circuit 31 includes transistors 311 and 312. A description will be given assuming that the transistor 311 according to this embodiment is a P-channel MOS transistor, and the transistor 312 is an N-channel MOS transistor. The source of the transistor 311 is electrically connected to the terminal 11 via the propagation node 21. Also, the drain of the transistor 311 is electrically connected to the drain of the transistor 312. The source of the transistor 312 is electrically connected to the terminal 12 via the propagation node 22. In addition, a signal generated at a connection point at which the drain of the transistor 311 and the drain of the transistor 312 are electrically connected is input to various constituent elements of the integrated circuit device 1.

In addition, the gates of the transistors 311 and 312 are electrically connected to the terminal 14 via a propagation node 24. When the voltage signal Vi at an H level is input to the terminal 14, control is performed so as to switch off the transistor 311, and switch on the transistor 312. Therefore, an L-level signal is input to various constituent elements in the integrated circuit device 1. On the other hand, when the voltage signal Vi at the L level is input to the terminal 14, control is performed so as to switch on the transistor 311, and switch off the transistor 312. Therefore, an H-level signal is input to various constituent elements in the integrated circuit device 1.

As described above, in the integrated circuit device 1 according to the fourth embodiment, the internal circuit 31 functions as an input circuit that supplies a signal that is based on the voltage signal Vi that is input to various constituent elements of the integrated circuit device 1, and the terminal 14 functions as an input terminal to which the voltage signal Vi is input.

The electrostatic protection circuit 40 includes the protection circuits 41, 42, and 43, the diode 44, and the resistor 45. The diode 44 is provided between the discharge node 46 and the propagation node 21 electrically connected to the terminal 11. The resistor 45 is provided between the discharge node 46 and the propagation node 21 electrically connected to the terminal 11. Accordingly, the diode 44 and the resistor 45 are provided in parallel between the propagation node 21 and the discharge node 46.

One end of the protection circuit 41 is electrically connected to the propagation node 21 electrically connected to the terminal 11, and the other end is electrically connected to the propagation node 22 electrically connected to the terminal 12. In other words, the protection circuit 41 is electrically connected to the terminal 11 and the terminal 12. Also, one end the protection circuit 42 is electrically connected to the discharge node 46, and the other end is electrically connected to the propagation node 24 electrically connected to the terminal 14. In other words, the protection circuit 42 is electrically connected to the discharge node 46 and the terminal 14. In addition, one end of the protection circuit 43 is electrically connected to the discharge node 46, and the other end is electrically connected to the propagation node 22 electrically connected to the terminal 12. In other words, the protection circuit 43 is electrically connected to the discharge node 46 and the terminal 12.

With the integrated circuit device 1 and the electrostatic protection circuit 40 being configured as described above, even if a surge voltage such as an electrostatic voltage occurs in the terminal 14 to which a signal is input from the outside, it is possible to mitigate the influence of the surge voltage on the internal circuit 31 in a manner similar to the electrostatic protection circuits 40 according to the first to third embodiments.

5. Fifth Embodiment

Figure 16:
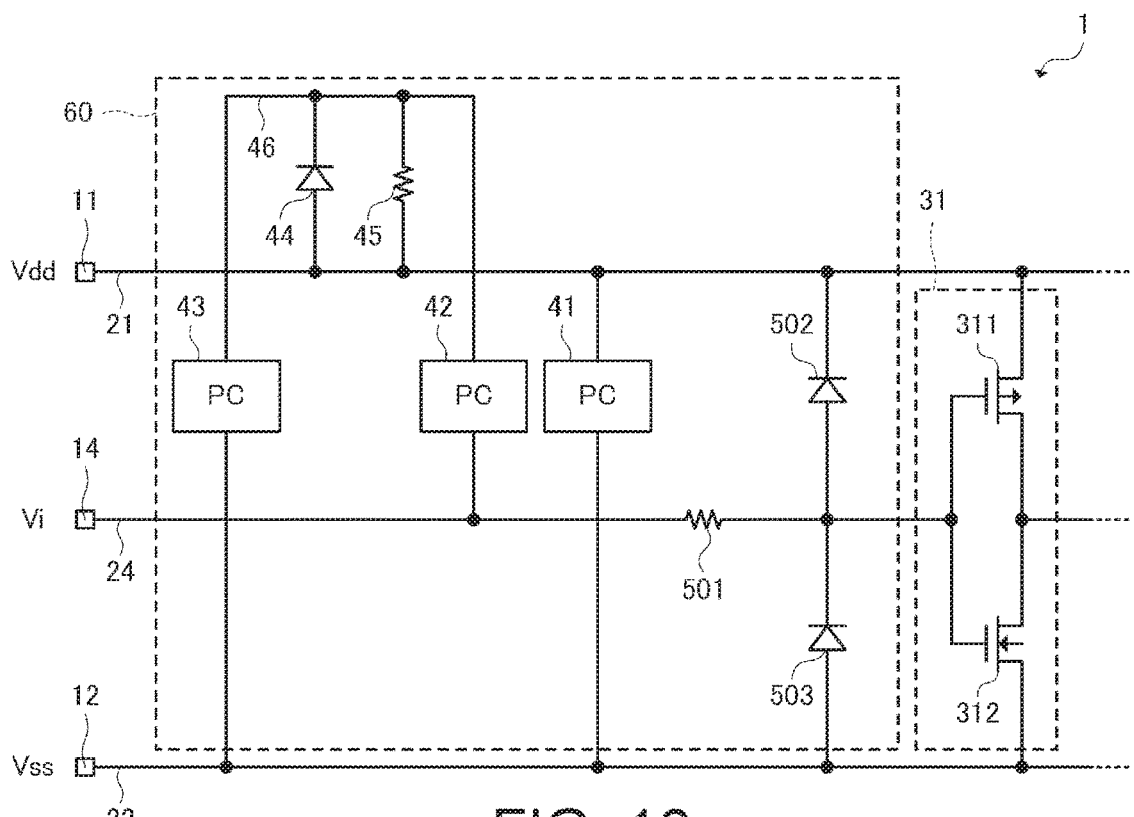
FIG. 16 is a diagram showing the configuration of an integrated circuit device 1 according to a fifth embodiment.

Next, an integrated circuit device 1 provided with an electrostatic protection circuit 40 according to a fifth embodiment will be described. FIG. 16 is a diagram showing the configuration of the integrated circuit device 1 according to the fifth embodiment. The electrostatic protection circuit 40 according to the fifth embodiment has a configuration for protecting the gates of the transistors 311 and 312 of the internal circuit 31, in addition to the configuration of the electrostatic protection circuit 40 according to the fourth embodiment that operates based on a signal input from the terminal 14 that inputs various signals to the integrated circuit device 1, thereby mitigating a risk that the thicknesses of the gate films of the transistors 311 and 312 will increase. Accordingly, it is possible to mitigate a risk that the sizes of the transistors 311 and 312 will increase and a risk that the operation speeds of the transistors 311 and 312 will decrease.

As shown in FIG. 16, the integrated circuit device 1 includes the terminal 11, 12, and 14, the internal circuit 31, and the electrostatic protection circuit 40.

The internal circuit 31 includes the transistors 311 and 312. The source of the transistor 311 is electrically connected to the terminal 11 via the propagation node 21. Also, the drain of the transistor 311 is electrically connected to the drain of the transistor 312. The source of the transistor 312 is electrically connected to the terminal 12 via the propagation node 22. In addition, a signal generated at a connection point at which the drain of the transistor 311 and the drain of the transistor 312 are electrically connected is input to various constituent elements of the integrated circuit device 1.

In addition, the gates of the transistors 311 and 312 are electrically connected to the terminal 14 via a resistor 501 and the propagation node 24. When the voltage signal Vi at the H level is input to the terminal 14, control is performed so as to switch off the transistor 311 and switch on the transistor 312. Therefore, an L-level signal is input to various constituent elements in the integrated circuit device 1. On the other hand, when the voltage signal Vi at the L level is input to the terminal 14, control is performed so as to switch on the transistor 311, and switch off the transistor 312. Therefore, an H-level signal is input to various constituent elements in the integrated circuit device 1.

The electrostatic protection circuit 40 includes the protection circuits 41, 42, and 43, the diode 44, the resistor 45, the resistor 501, and diodes 502 and 503. The diode 44 is provided between the discharge node 46 and the propagation node 21 electrically connected to the terminal 11. The resistor 45 is provided between the discharge node 46 and the propagation node 21 electrically connected to the terminal 11. Accordingly, the diode 44 and the resistor 45 are provided in parallel between the propagation node 21 and the discharge node 46.

One end of the protection circuit 41 is electrically connected to the propagation node 21 electrically connected to the terminal 11, and the other end is electrically connected to the propagation node 22 electrically connected to the terminal 12. In addition, one end of the protection circuit 42 is electrically connected to the discharge node 46, and the other end is electrically connected to the propagation node 24 electrically connected to the terminal 14. In addition, one end of the protection circuit 43 is electrically connected to the discharge node 46, and the other end is electrically connected to the propagation node 22 electrically connected to the terminal 12.

One end of the resistor 501 is electrically connected to the terminal 14, and the other end is electrically connected to the gates of the transistors 311 and 312 of the internal circuit 31. The anode of the diode 502 is electrically connected to the other end of the resistor 501 and the gates of the transistors 311 and 312 of the internal circuit 31, and the cathode of the diode 502 is electrically connected to the terminal 11 via the propagation node 21. The anode of the diode 503 is electrically connected to the terminal 12 via the propagation node 22, and the cathode is electrically connected to the other end of the resistor 501 and the gates of the transistors 311 and 312 of the internal circuit 31.

Accordingly, the electrostatic protection circuit 40 according to the fifth embodiment includes the resistor 501 whose one end is electrically connected to the terminal 14, and whose other end is electrically connected to the internal circuit 31, the diode 502 whose anode is electrically connected to the other end of the resistor 501, and whose cathode is electrically connected to the terminal 11, and the diode 503 whose anode is electrically connected to the terminal 12, and whose cathode is electrically connected to the other end of the resistor 501.

In the electrostatic protection circuit 40 according to the fifth embodiment configured as described above, if the potential of the voltage signal Vi that is input to the terminal 14 is larger than that of the voltage signal Vdd, a voltage that is input to the gates of the transistors 311 and 312 is limited by the diode 502, and if the potential of the voltage signal Vi that is input to the terminal 14 is smaller than that of the voltage signal Vss, a voltage that is input to the gates of the transistors 311 and 312 is limited by the diode 503.

Therefore, with the electrostatic protection circuit 40 according to the fifth embodiment, in addition to the actions and effects of the electrostatic protection circuit 40 according to the fourth embodiment, it is possible to mitigate a risk that the thicknesses of the gate films of the transistors 311 and 312 will increase, and it is also possible to mitigate a risk that the sizes of the transistors 311 and 312 will increase, and a risk that the operation speeds of the transistors 311 and 312 will decrease.

Here, the resistor 501 is an example of a second resistive element according to the fifth embodiment, the diode 502 is an example of a third diode element according to the fifth embodiment, and the diode 503 is an example of a fourth diode element according to the fifth embodiment.

6. Sixth Embodiment

Figure 17:
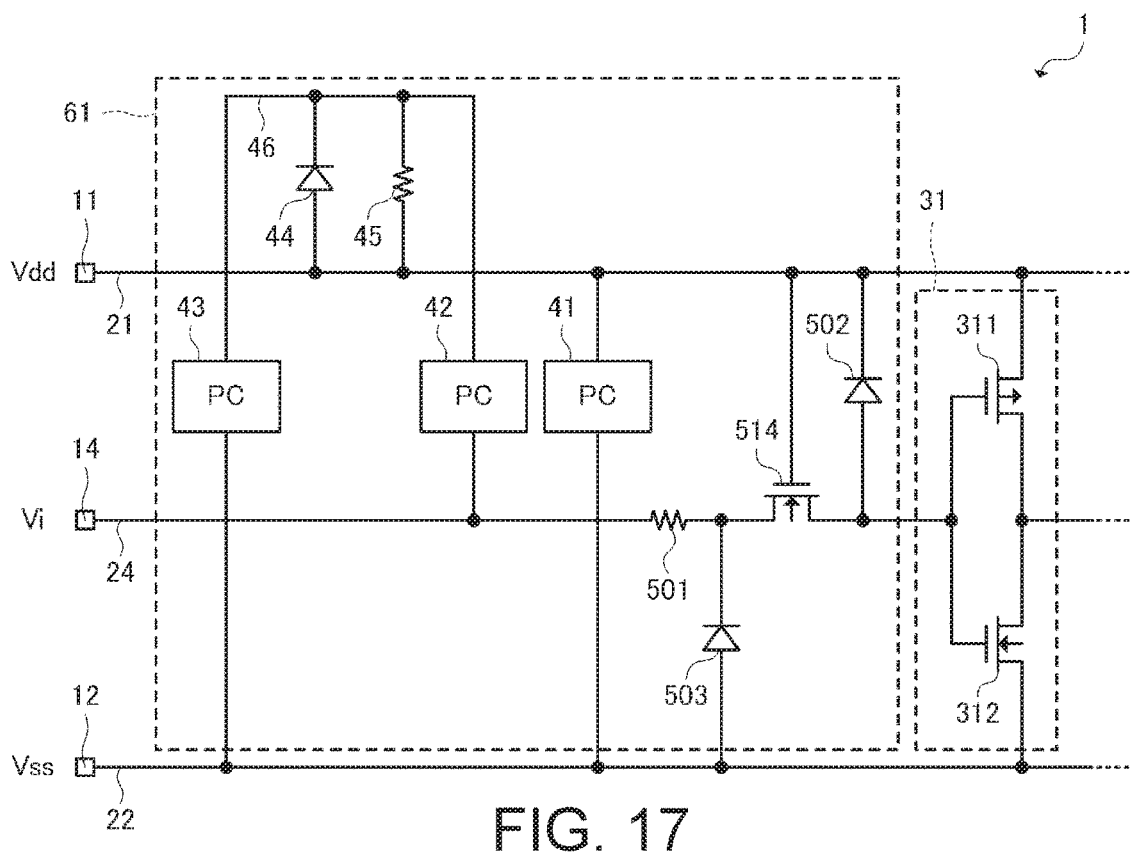
FIG. 17 is a diagram showing the configuration of an integrated circuit device 1 according to a sixth embodiment.

Next, an integrated circuit device 1 provided with an electrostatic protection circuit 40 according to a sixth embodiment will be described. FIG. 17 is a diagram showing the configuration of the integrated circuit device 1 according to the sixth embodiment. The electrostatic protection circuit 40 according to the sixth embodiment is different from the electrostatic protection circuit 40 according to the fifth embodiment, in that a transistor 514 for protecting the transistors 311 and 312 of the internal circuit 31 is provided.

With the electrostatic protection circuit 40 according to the fifth embodiment, when the voltage signal Vi whose potential is larger than that of the voltage signal Vdd is supplied to the terminal 14, it is possible to protect the transistors 311 and 312 of the internal circuit 31, mitigate a risk that the sizes of the transistors 311 and 312 will increase, and also mitigate a risk that the operation speeds of the transistors 311 and 312 will decrease, but there is a risk that a leak current that flows from the propagation node 24 toward the propagation node 21 via the diode 502 will be generated.

In the electrostatic protection circuit 40 according to the sixth embodiment, it is possible to reduce a leak current that flows from the propagation node 24 toward the propagation node 21 via the diode 502, by providing the transistor 514 between the other end of the resistor 501 and the anode of the diode 502, as shown in FIG. 17.

Specifically, the electrostatic protection circuit 40 includes the resistor 501 whose one end is electrically connected to the terminal 14, the transistor 514 whose drain is electrically connected to the other end of the resistor 501, whose source is electrically connected to the internal circuit 31, and whose gate is electrically connected to the terminal 11, the diode 502 whose anode is electrically connected to the source of the transistor 514, and whose cathode is electrically connected to the terminal 11, and the diode 503 whose anode is electrically connected to the terminal 12, and whose cathode is electrically connected to the other end of the resistor 501. Note that a structure in which the source of the transistor 514 is electrically connected to the internal circuit 31 or a structure in which the source and the semiconductor substrate 50 are electrically connected to the internal circuit 31 may also be adopted.

In the electrostatic protection circuit 40 according to the sixth embodiment configured as described above, when the potential of the anode of the diode 502, namely the potential of the gate of the transistor 311 or 312 of the internal circuit 31 exceeds the potential of the voltage signal Vdd that propagates in the propagation node 21, control is performed so as to switch off the transistor 514. Therefore, it is possible to reduce a leak current that is generated and flows from the propagation node 24 toward the propagation node 21 via the diode 502. Accordingly, with the electrostatic protection circuit 40 according to the sixth embodiment, in addition to actions and effects of the electrostatic protection circuit 40 according to the fifth embodiment, it is possible to mitigate a risk that a leak current will be generated in the diode 502.

Here, the resistor 501 is an example of a second resistive element according to the sixth embodiment, the diode 502 is an example of a third diode element according to the sixth embodiment, the diode 503 is an example of a fourth diode element according to the sixth embodiment, and the transistor 514 is an example of an NMOS transistor.

7. Seventh Embodiment

Figure 18:
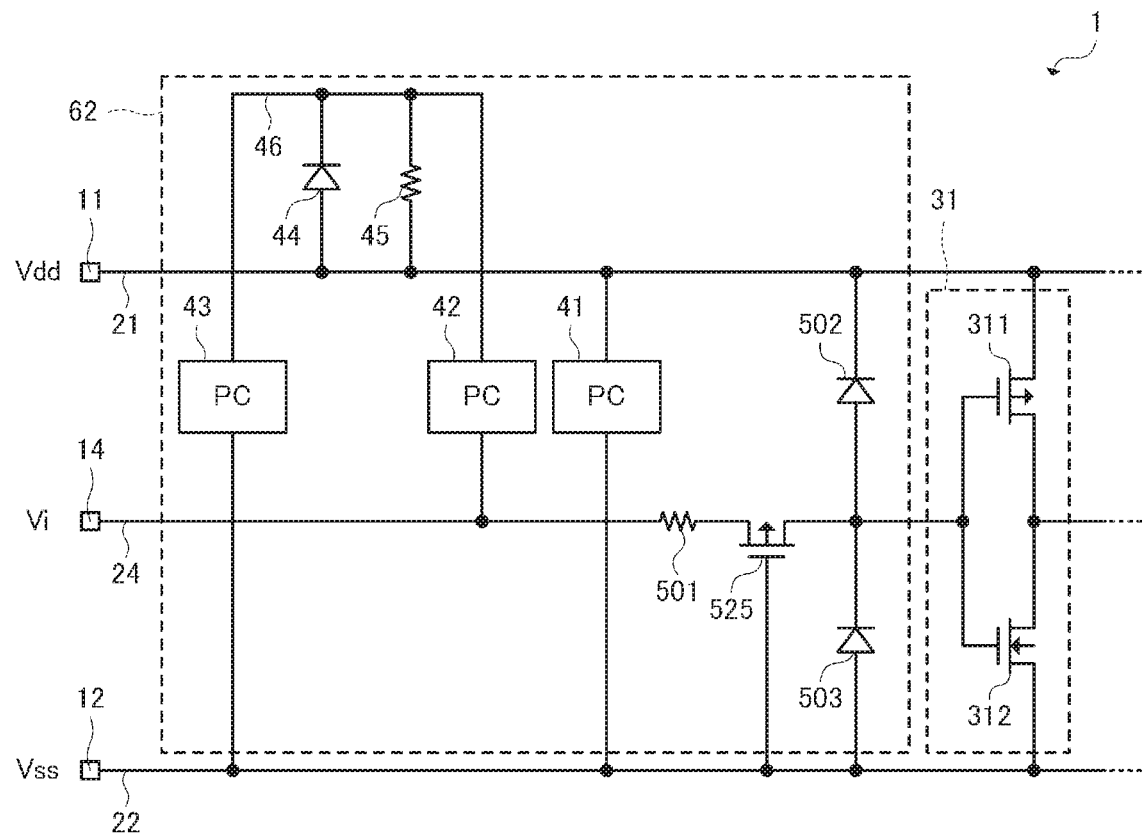
FIG. 18 is a diagram showing the configuration of an integrated circuit device 1 according to a seventh embodiment.

Next, an integrated circuit device 1 provided with an electrostatic protection circuit 40 according to a seventh embodiment will be described. FIG. 18 is a diagram showing the configuration of the integrated circuit device 1 according to the seventh embodiment. The electrostatic protection circuit 40 according to the seventh embodiment is different from the electrostatic protection circuit 40 according to the fifth embodiment, in that a transistor 525 for protecting the transistors 311 and 312 of the internal circuit 31 is provided.

With the electrostatic protection circuit 40 according to the fifth embodiment, when the voltage signal Vi whose potential is smaller than that of the voltage signal Vss is supplied to the terminal 14, there is a risk that a leak current that flows from the propagation node 22 to the propagation node 24 via the diode 503 will be generated.

In the electrostatic protection circuit 40 according to the seventh embodiment, it is possible to reduce a leak current that is generated and flows from the propagation node 22 toward the propagation node 24 via the diode 503, by providing the transistor 525 between the other end of the resistor 501 and the anode of the diode 502 and the cathode of the diode 503, as shown in FIG. 18.

Specifically, the electrostatic protection circuit 40 includes the resistor 501 whose one end is electrically connected to the terminal 14, the transistor 525 whose drain is electrically connected to the other end of the resistor 501, whose source is electrically connected to the internal circuit 31, and whose gate is electrically connected to the terminal 11, the diode 502 whose anode is electrically connected to the source of the transistor 525, and whose cathode is electrically connected to the terminal 11, and the diode 503 whose anode is electrically connected to the terminal 12, and whose cathode is electrically connected to the source of the transistor 525. Note that a structure in which the source of the transistor 525 is electrically connected to the internal circuit 31, or a structure in which the source and the semiconductor substrate 50 are electrically connected to the internal circuit 31 may also be adopted.

In the electrostatic protection circuit 40 according to the seventh embodiment configured as described above, when the potential of the cathode of the diode 503, namely the potential of the gate of the transistor 311 or 312 of the internal circuit 31, is smaller than the potential of the voltage signal Vss that propagates in the propagation node 22, control is performed so as to switch off the transistor 525. Therefore, it is possible to reduce a leak current that is generated and flows from the propagation node 22 toward the propagation node 24 via the diode 503. Accordingly, with the electrostatic protection circuit 40 according to the seventh embodiment, in addition to the actions and effects of the electrostatic protection circuit 40 according to the fifth embodiment, it is possible to mitigate a risk that a leak current will be generated in the diode 503.

Here, the resistor 501 is an example of a second resistive element according to the seventh embodiment, the diode 502 is an example of a third diode element according to the seventh embodiment, the diode 503 is an example of a fourth diode element according to the seventh embodiment, and the transistor 525 is an example of a PMOS transistor.

As described above, the embodiments and the modifications have been described, but the present disclosure is not limited to these embodiments, and can be implemented in various modes without departing from the scope of the disclosure. For example, the above-embodiments can be appropriately combined.

The present disclosure includes substantially the same configurations (configurations with the same functions, methods, and results, or configurations with the same objects and effects, for example) as the configurations described in the embodiments. The present disclosure includes configurations in which an unessential part of the configurations described in the embodiments is replaced. The present disclosure also includes configurations that achieve the same effects as those of the configurations described in the embodiments, or configurations that can achieve the same objects as those of the configurations described in the embodiments. The present disclosure also includes configurations obtained by adding a known technique to the configurations described in the embodiments.

What is claimed is:

1. An electrostatic protection circuit that is electrically connected to a first terminal to which a first voltage signal is input, a second terminal to which a second voltage signal whose potential is lower than that of the first voltage signal is input, and a connection terminal that is connected to an external circuit, and mitigates the influence of a surge voltage on an internal circuit, the electrostatic protection circuit comprising:
    a discharge node that is electrically connected to the first terminal via a first diode element;
    a first protection circuit that is electrically connected to the first terminal and the second terminal;
    a second protection circuit that is electrically connected to the discharge node and the connection terminal; and
    a third protection circuit that is electrically connected to the discharge node and the second terminal,
    wherein an anode of the first diode element is electrically connected to the first terminal, and a cathode of the first diode element is electrically connected to the discharge node.

2. The electrostatic protection circuit according to claim 1,
    wherein the second protection circuit includes:
    a second diode element whose anode is electrically connected to the connection terminal, and whose cathode is electrically connected to the discharge node,
    a thyristor element whose anode is electrically connected to the discharge node, and whose cathode is electrically connected to the connection terminal, and
    a trigger element that is electrically connected to a gate of the thyristor element, and causes the thyristor element to operate,
    the thyristor element includes:
    a first impurity-doped region provided on a substrate, and
    a second impurity-doped region provided in the first impurity-doped region,
    the anode of the thyristor element is provided in the first impurity-doped region, and
    the cathode of the thyristor element is provided in the second impurity-doped region.

3. The electrostatic protection circuit according to claim 1,
    wherein the second protection circuit includes:
    a second diode element whose anode is electrically connected to the connection terminal, and whose cathode is electrically connected to the discharge node,
    a thyristor element whose cathode is electrically connected to the connection terminal,
    a voltage limiting element that is electrically connected to an anode of the thyristor element, and
    a trigger element that is electrically connected to a gate of the thyristor element, and causes the thyristor element to operate,
    the thyristor element includes:
    a first impurity-doped region provided on a substrate, and a second impurity-doped region provided in the first impurity-doped region, the anode of the thyristor element is provided in the first impurity-doped region, and the cathode of the thyristor element is provided in the second impurity-doped region.

4. The electrostatic protection circuit according to claim 1, further comprising a first resistive element whose one end is electrically connected to the first terminal, and whose other end is electrically connected to the discharge node.

5. The electrostatic protection circuit according to claim 1, further comprising:

a second resistive element whose one end is electrically connected to the connection terminal, and whose other end is electrically connected to the internal circuit;

a third diode element whose anode is electrically connected to the other end of the second resistive element, and whose cathode is electrically connected to the first terminal; and a fourth diode element whose anode is electrically connected to the second terminal, and whose cathode is electrically connected to the other end of the second resistive element.

6. The electrostatic protection circuit according to claim 1, further comprising:

a second resistive element whose one end is electrically connected to the connection terminal;

an NMOS transistor whose drain is electrically connected to another end of the second resistive element, whose source is electrically connected to the internal circuit, and whose gate is electrically connected to the first terminal;

a third diode element whose anode is electrically connected to the source of the NMOS transistor, and whose cathode is electrically connected to the first terminal; and a fourth diode element whose anode is electrically connected to the second terminal, and whose cathode is electrically connected to the other end of the second resistive element.

7. The electrostatic protection circuit according to claim 1, further comprising:

a second resistive element whose one end is electrically connected to the connection terminal;

a PMOS transistor whose drain is electrically connected to another end of the second resistive element, whose source is electrically connected to the internal circuit, and whose gate is electrically connected to the second terminal;

a third diode element whose anode is electrically connected to the source of the PMOS transistor, and whose cathode is electrically connected to the first terminal; and a fourth diode element whose anode is electrically connected to the second terminal, and whose cathode is electrically connected to the source of the PMOS transistor.

* * * * *